US00RE36851E

United States Patent [19]

Shinozaki

[11] E Patent Number: Re. 36,851

[45] Reissued Date of Patent: Sep. 5, 2000

[54] METHOD AND CIRCUIT FOR SHORTCIRCUITING DATA TRANSFER LINES AND SEMICONDUCTOR MEMORY DEVICE HAVING THE CIRCUIT

[75] Inventor: Naoharu Shinozaki, Fuchu, Japan

[73] Assignee: Fujitsu Limited, Kawasaki, Japan

[21] Appl. No.: 09/300,601

[22] Filed: Apr. 28, 1999

Related U.S. Patent Documents

Reissue of:

[64] Patent No.: 5,625,592
Issued: Apr. 29, 1997
Appl. No.: 08/657,484
Filed: May 23, 1996

[30] Foreign Application Priority Data

Nov. 20, 1995 [JP] Japan ..... 7-301743

[51] Int. Cl.[7] ..... G11C 7/00

[52] U.S. Cl. ..... 365/189.01; 365/203; 365/204

[58] Field of Search ..... 365/203, 204, 365/189.01, 190, 191

[56] References Cited

U.S. PATENT DOCUMENTS

| | | | |
|---|---|---|---|
| 4,996,671 | 2/1991 | Suzuki et al. | 365/203 |
| 5,313,434 | 5/1994 | Abe | 365/203 |
| 5,321,657 | 6/1994 | Arimoto et al. | 365/203 |
| 5,487,043 | 1/1996 | Furutani et al. | 365/203 |
| 5,734,619 | 3/1998 | Numata et al. | 365/230.03 |

*Primary Examiner*—Son Mai
*Attorney, Agent, or Firm*—Armstrong, Westerman, Hattori, McLeland & Naughton

[57] ABSTRACT

There is provided a method of controlling data transmission lines of a semiconductor memory device which has a first pair of data transmission lines to which a sense amplifier and memory cells are connected, and a second pair of data transmission lines to which a read circuit and a write circuit are connected at an end of the second pair of the data transmission lines, which is connected to the first pair of data transmission lines via a column gate. The method includes a) shortcircuiting the second pair of data transmission lines for a first period when a read operation is carried out, and b) shortcircuiting the second pair of data transmission lines for a second period when a write operation is carried out, the second period being shorter than the first period.

46 Claims, 15 Drawing Sheets

(READ)

(WRITE)

(READ)

(WRITE)

(READ)

(WRITE)

METHOD AND CIRCUIT FOR SHORTCIRCUITING DATA TRANSFER LINES AND SEMICONDUCTOR MEMORY DEVICE HAVING THE CIRCUIT

Matter enclosed in heavy brackets [ ] appears in the original patent but forms no part of this reissue specification; matter printed in italics indicates the additions made by reissue.

BACKGROUND THE INVENTION

1. Field of the Invention

The present invention generally relates to a method and circuit for shortcircuiting a pair of data transfer lines of a semiconductor memory device in which complementary data signals are transmitted over the pair of data transfer lines in order to write data in a memory cell array or read data therefrom.

A DRAM (Dynamic Random Access Memory) device is known as such a semiconductor memory device in which complementary read or write data signals are transmitted over a pair of transfer lines to which a plurality of rows of memory cells (such lines are referred to as global data transfer lines) are connected via local data transfer lines. Usually, such a pair of global data transfer lines, which functions as a global data bus, is connected together (shortcircuited) in order to precharge the pair of global data transfer lines and thus speed up the operation of the device. It is necessary to take into consideration a timing at which the pair of global data transfer lines is released from the precharged state. This consideration is important particularly for high-speed memory devices such as synchronous DRAM devices (hereinafter referred to as SDRAM devices) and asynchronous DRAM devices needed to operate with an operation cycle of 100 MHz or higher.

SUMMARY OF THE INVENTION

It is an object of the present invention to provide a method and circuit for shortcircuiting a pair of data transfer lines which makes it possible to speed up the read and write operations of a semiconductor memory device.

This object of the present invention is achieved by a method of controlling data transmission lines of a semiconductor memory device which has a first pair of data transmission lines to which a sense amplifier and memory cells are connected, and a second pair of data transmission lines to which a read circuit and a write circuit are connected at an end of the second pair of the data transmission lines, which is connected to the first pair of data transmission lines via a column gate, the method comprising: a) shortcircuiting the second pair of data transmission lines for a first period when a read operation is carried out; and b) shortcircuiting the second pair of data transmission lines for a second period when a write operation is carried out, the second period being shorter than the first period.

The above object of the present invention is also achieved by a semiconductor device comprising: memory cells; a sense amplifier; a first pair of data transmission lines to which the sense amplifier and memory cells are connected; a second pair of data transmission lines to which a read circuit and a write circuit are connected at an end of the second pair of the data transmission lines, which is connected to the first pair of data transmission lines via a column gate; a shortcircuiting element which can shortcircuit the second pair of data transmission lines; and a first control circuit which controls the shortcircuiting element so that the second pair of data transmission lines is shortcircuited for a first period when a read operation is carried out, and the second pair of data transmission lines is shortcircuited for a second period when a write operation is carried out, the second period being shorter than the first period.

The second pair of data transmission lines may comprise: a third pair of data transmission lines to which the first pair of data transmission lines is connected; and a fourth pair of data transmission lines to which the read circuit and the write circuit are connected, the fourth part of data transmission lines being coupled to the third pair of data transmission lines via a switch circuit.

The semiconductor device may further comprise a precharging circuit which supplies a precharge voltage to the second pair of data transmission lines.

The precharging circuit may supply the precharge voltage to the second pair of data transmission lines while the second pair of data transmission lines is being shortcircuited, and does not supply the precharge voltage thereto when the second pair of data transmission lines is not shortcircuited.

The first control circuit may control the shortcircuiting element so that a timing at which the second pair of data transmission lines is shortcircuited substantially coincides with a first signal defining an operation timing in the read and write operations, and a timing at which the second pair of data transmission lines is released from a shortcircuited state in the write operation is earlier, with respect to the first signal, than a timing at which the second pair of data transmission lines is released from the shortcircuited state in the read operation.

The first control circuit may control the shortcircuiting element so that the second pair of data transmission lines is released from a shortcircuited state in the read operation after the second pair of data transmission lines is precharged to the precharge voltage.

The first control circuit may control the shortcircuiting element so that the second pair of data transmission lines is released from a shortcircuited state in the write operation before the second pair of data transmission lines is precharged to the precharge voltage.

The write circuit may have a driving capability of setting the second pair of data transmission lines to the precharge voltage faster than the precharging circuit precharges the second pair of data transmission lines to the precharge voltage when the write circuit inverts complementary signals on the second pair of data transmission lines.

The first control circuit may comprise: a second control circuit which controls timings at which the second pair of data transmission lines is shortcircuited and released from a shortcircuited state in the write operation; a third control circuit which controls timings at which the second pair of data transmission lines is shortcircuited and released from the shortcircuited state in the read operation; and a fourth control circuit which controls a timing at which the shortcircuiting element shortcircuits the second pair of data transmission lines on the basis of output signals of the second and third control circuits.

The second control circuit may comprise a first NAND circuit which performs a NAND operation on a first signal defining an operation timing and a second signal indicating whether an operation mode of the semiconductor memory device is the write operation or the read operation. The third control circuit may comprise a first delay circuit delaying the first signal, and a second NAND circuit performing a NAND operation on an output signal of the first delay circuit and the first signal. The fourth control circuit may comprise a third NAND circuit performing a NAND operation on an output signal of the second control circuit and an output signal of the third control circuit, and a first inverting delay circuit which inverts and delays an output signal of the third NAND circuit.

The first signal may be a signal synchronized with an external clock applied to the semiconductor memory device.

The semiconductor memory device may further comprise a second control circuit which controls enabling of the write circuit which outputs data to the second pair of data transmission lines at almost the same time as the second pair of data transmission lines is released from a shortcircuited state.

The second control circuit may control the write circuit on the basis of a first signal defining an operation timing and a second signal indicating whether an operation mode of the semiconductor memory device is the write operation or the read operation.

The second control circuit may comprise: a first inverting circuit which inverts the first signal; a second inverting circuit which inverts the second signal; a first NOR circuit which performs a NOR operation on output signals of the first and second inverting circuits; and a first delay circuit which delays an output signal of the first NOR circuit.

The semiconductor memory device may further comprise a second control circuit which controls enabling of the write circuit on the basis of a first signal defining an operation timing and a second signal indicating whether an operation mode of the semiconductor memory device is the write operation or the read operation.

The second control circuit may comprise: a first inverting circuit which inverts the first signal; a first NOR circuit which performs a NOR operation on an output signal of the first inverting circuit and the second signal; and a first delay circuit which delays an output signal of the first NOR circuit.

The semiconductor memory device may further comprise a second control circuit which delays the first signal to generate a third signal used to control timings at which the column gate is selected and released from a selected state at respective timings which are common to the read operation and the write operation.

The semiconductor memory device may further comprise: a second control circuit which controls timings at which a column is selected and released from a selected state in the read and write operations; and a third control circuit which controls timings at which the column gate is selected and released from the selected state, wherein the timing at which the column gate is selected in the write operation lags behind the timing at which the column gate is selected in the read operation, and the timing at which the column gate is released from the selected state in the read operation substantially coincides with the timing at which the column gate is released from the selected state in the write operation.

The second control circuit may comprise: a first invention circuit which inverts a first signal defining an operation timing; a first inverting delay circuit which inverts and delays an output signal of the first inverting circuit; a first NAND circuit which performs a NAND operation on a second signal indicating whether an operation mode of the semiconductor memory device is the write operation or the read operation and an output signal of the first inverting circuit; and a first delay circuit delays an output signal of the first NAND circuit. The third control circuit may comprise: a second NAND circuit which performs a NAND operation on an output signal of the first inverting delay circuit and an output signal of the first delay circuit; and a second inverting circuit which inverts an output signal of the second NAND circuit.

The semiconductor memory device may further comprise: a second control circuit which controls timings at which a column is selected and released from a selected state in the read operation; a third control circuit which controls timing at which a column is selected and released from the selected state in the write operation; a fourth control circuit which generates, from output signals of the second and third control circuits, a third signal which controls timings at which the column gate is selected and released from the selected state; and a fifth control circuit which controls the second control circuit. The timings at which the column gate is selected and released from the selected state in the write operation lag behind the timings at which the column gate is selected and released from the selected state in the read operation.

The second control circuit may comprise: a first inverting circuit which inverts a first signal defining an operation timing; a first NAND circuit which performs a NAND operation on an output signal of the first inverting circuit and an output signal of the fifth control circuit; and a first delay circuit which delays an output signal of the first NAND circuit. The third control circuit may comprise: a second NAND circuit which performs a NAND operation on a second signal indicating whether an operation mode of the semiconductor memory device is the write operation or the read operation and an output signal of the first inverting circuit; and a second delay circuit which delays an output signal of the second NAND circuit. The fourth control circuit may comprise: a third NAND circuit which performs a NAND operation on output signals of the second and third control circuits; and a second inverting circuit which inverts an output signal of the third NAND circuits. The fifth control circuits may comprise: a third delay circuit which delays the second signal; and a fourth NAND circuit which performs a NAND operation on an output signal of the third delay circuit and the second signal.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

In order to facilitate understanding of the present invention, a description will first be given of related art of the present invention.

Figure 1:
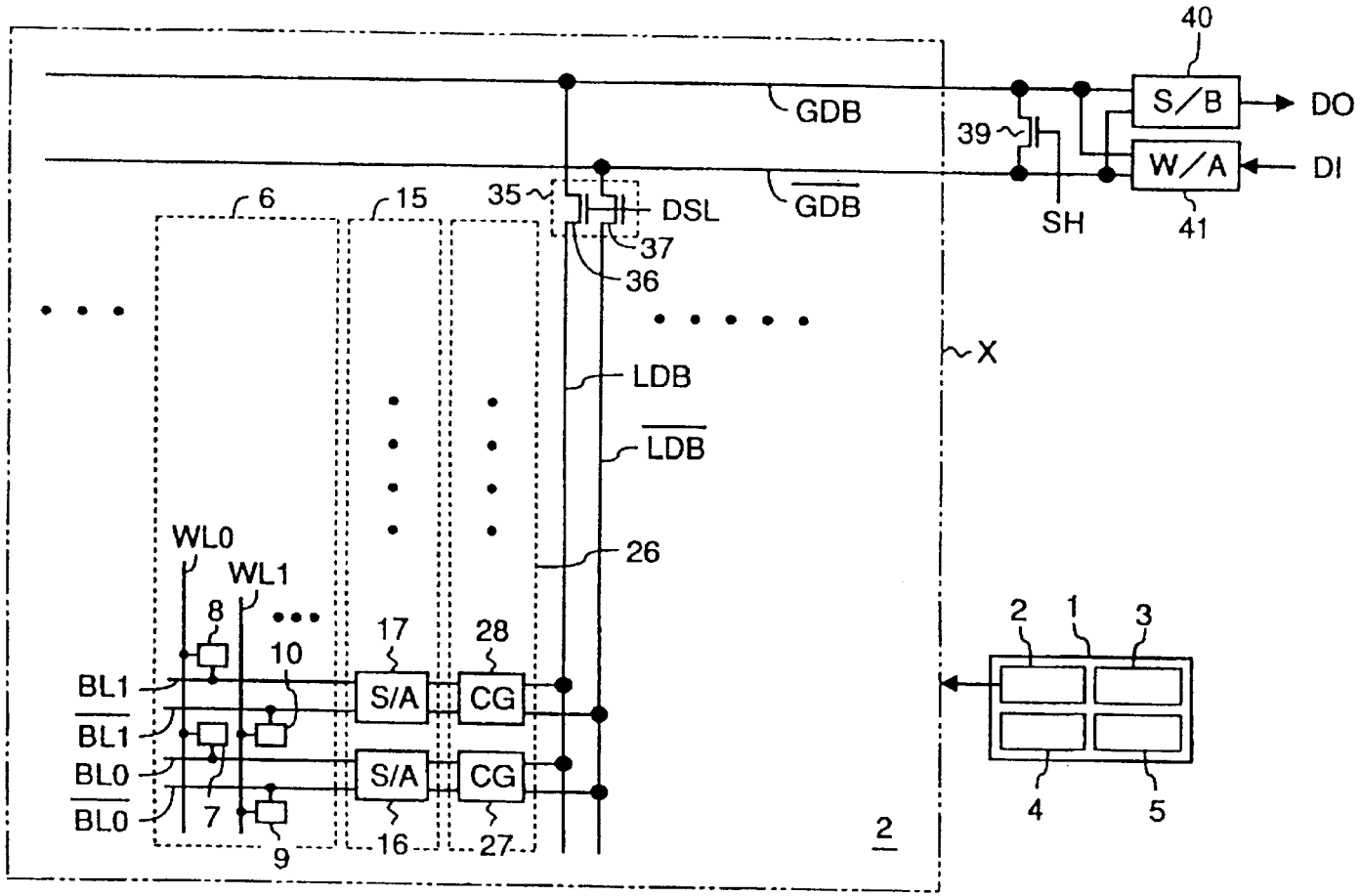
FIG. 1 is a block diagram of a SDRAM device related to the present invention.

FIG. 1 is a block diagram of an SDRAM device. The SDRAM device includes a chip main body 1 on which a plurality of memory cell areas 2 through 5 are formed. A block depicted by a two-dot chained line is an enlargement of the memory cell area 2 and part of a peripheral circuit of the memory cell area 2. The memory cell area 2 includes a memory cell array 6, which includes memory cells 7–10, word lines WL0 and WL1 for selecting memory cells 7–10, and pair of bit lines BL0 and /BL0, and BL1 and /BL1.

Figure 2:
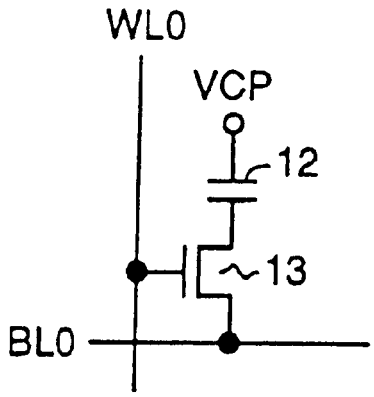
FIG. 2 is a circuit diagram of a memory cell shown in FIG. 1.

FIG. 2 is a circuit diagram of the memory cell 7. The memory cell 7 includes a cell capacitor 12 and a cell transistor 13. The cell capacitor 12 functions to store data. The cell transistor 13 is turned ON/OFF by controlling the word line WL0 so that the charging and discharging of the cell capacitor 12 can be controlled. A cell plate voltage VCP is applied to one end of the cell capacitor 12. The other memory cells 8–10 are configured in the same manner as the memory cell 7.

Turning now to FIG. 1, the SDRAM device includes a row 15 of sense amplifiers (S/A), each of which amplifies the difference between the potentials of the corresponding pair of bit lines. A sense amplifier 16 is provided to a pair of bit lines BL0 and /BL0, and a sense amplifier 17 is provided to a pair of bit lines BL1 and /BL1.

Figure 3:
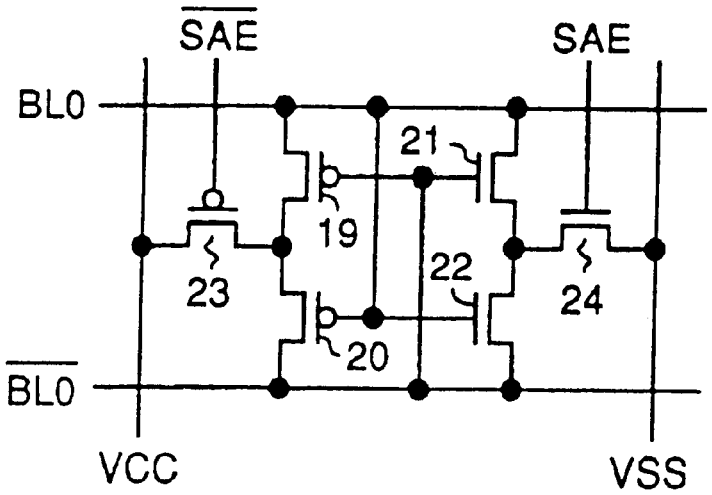
FIG. 3 is a circuit diagram of a sense amplifier shown in FIG. 1.

FIG. 3 is a circuit diagram of the sense amplifier 16, which includes pMOS (p-channel MOS) transistors 19 and 20, and nMOS (n-channel MOS) transistors, all of which transistors perform the amplifying operation of the sense amplifier. The pMOS transistors 19 and 20 perform the pull-up operation, and the nMOS transistors 21 and 22 perform the pull-down operation. Further, the sense amplifier 16 includes a pMOS transistor 23 and an nMOS transistor 24. The pMOS transistor 23 is turned ON and OFF in response to a sense amplifier activating signal /SAE. The nMOS transistor 24 is turned ON and OFF in response to a sense amplifier activating signal SAE. The pMOS transistor 23 is connected to a VCC power supply line VCC, and the nMOS transistor 24 is connected to a VSS ground line VSS.

Turning to FIG. 1 again, the sense amplifier includes a row 26 of column gates (CG) for selecting the columns. A column gate 27 is provided to the pair of bit lines BL and /BL0, and a column gate 28 is provided to the pair of bit lines BL1 and /BL1.

Figure 4:
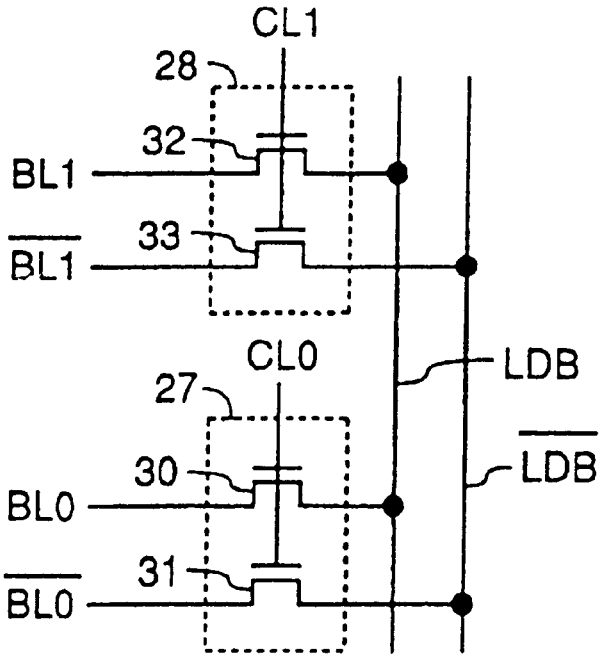
FIG. 4 is a circuit diagram of column gates shown in FIG. 1.

FIG. 4 is a circuit diagram of the column gates 27 and 28 shown in FIG. 1. The column gate 27 includes nMOS transistors 30 and 31 controlled by a column selecting signal CL0. The column gate 28 includes nMOS transistors 32 and 33 controlled by a column selecting signal CL1. The column gates 27 and 28 are connected to a pair of local data bus lines LDB and /LDB (local data transfer lines), which are commonly provided to other column gates as shown in FIG. 1. As shown in FIG. 1, the local data bus lines LDB and /LDB are respectively connected to global data bus lines GDB and /GDB through a data bus switch 35. A data bus switch signal DSL is applied to the data bus switch 35, which includes nMOS transistors 36 and 37. An nMOS transistor 39 controlled by a shortcircuiting (precharging) signal SH is provided between the global data bus lines GDB and /GDB, which are commonly provided to other pairs of local data bus lines. Hereinafter, the nMOS transistor 39 is referred to as a precharging transistor.

A sense buffer (S/B) 40, which is connected to the pair of global data bus lines GDB and /GDB, senses the potential difference therebetween and outputs read data DO. A write amplifier (W/A) 41 drives the pair of global data bus lines GDB and /GDB in response to write data DI. The precharging transistor 39 is disposed close to the input terminals of the sense buffer 40, in other words, the output terminals of the write amplifier 41.

Figure 5:
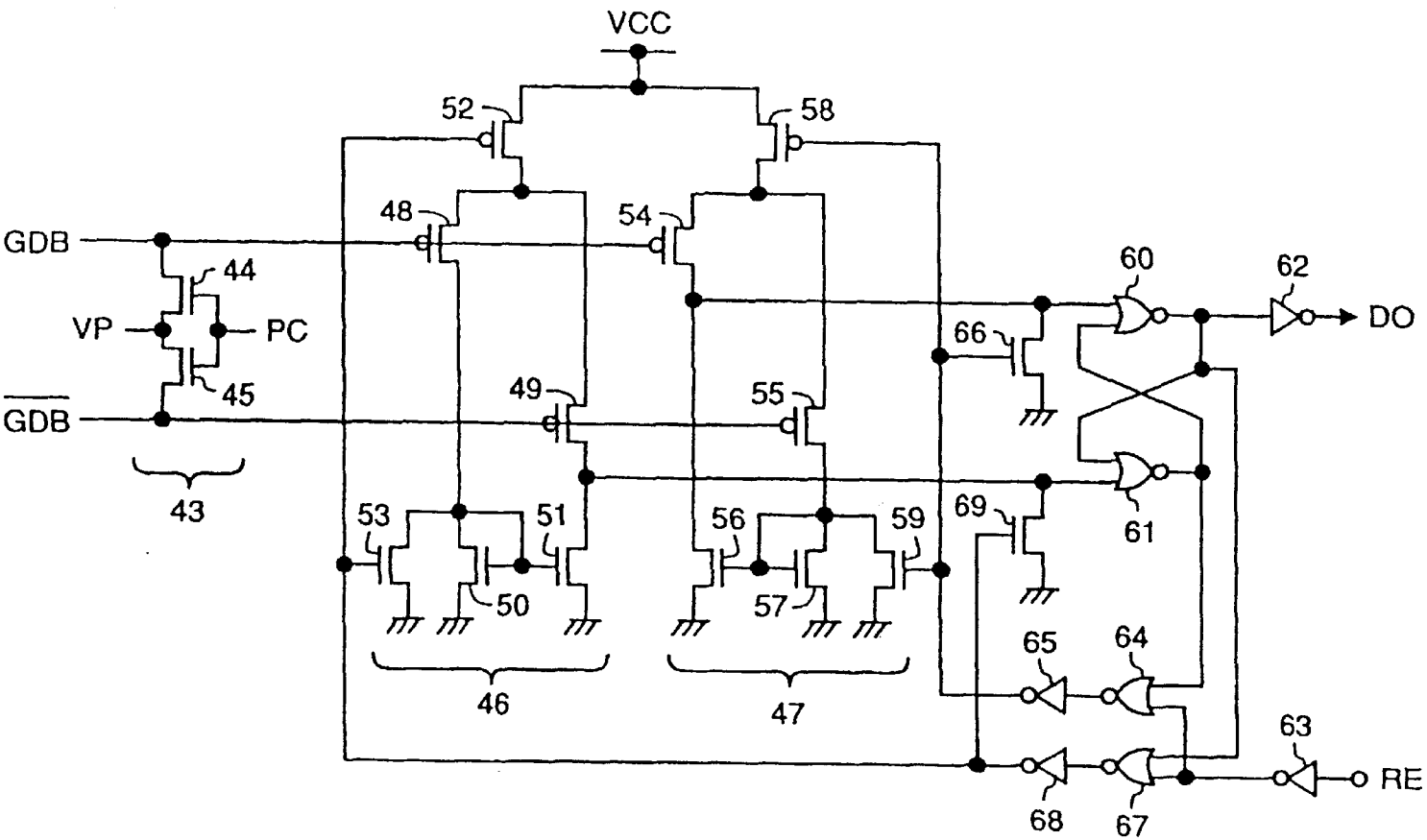
FIG. 5 is a circuit diagram of a sense buffer 40 shown in FIG. 1.

FIG. 5 is a circuit diagram of the sense buffer 40. The sense buffer 40 includes a precharge circuit 43, which precharges the global data bus lines GDB and /GDB to a precharge voltage VP lower than the power supply voltage VCC. The precharge circuit 43 includes nMOS transistors 44 and 45 controlled by a precharge signal PC. When the circuit parts relating to the column operate, the precharge signal PC is fixed to the power supply voltage VCC.

The sense buffer 40 includes current-mirror amplifier circuits 46 and 47. The current-mirror amplifier circuit 46 includes pMOS transistors 48 and 49 functioning as input transistors, nMOS transistors 50 and 51 connected in current-mirror formation, a pMOS transistor 52 enabling and disabling the current-mirror circuit 46, and an nMOS transistor 53 enabling and disabling the circuit 46. The current-mirror amplifier circuit 47 includes pMOS transistors 54 and 55 functioning as input transistors, nMOS transistors 56 and 57 connected in current-mirror formation, a pMOS transistor 58 enabling and disabling the circuit 47, and an nMOS transistor 59 enabling and disabling the circuit 47.

The sense buffer 40 includes NOR circuits 60 and 61, which form a flip-flop circuit, and an inverter 62 which inverts the output signal of the NOR circuit 60. A symbol RE denotes a read enable signal which instructs a read operation. A inverter 63 inverts the read enable signal RE. The read enable signal RE is high when the read operation is instructed, and is low when the write operation is instructed.

The sense buffer 40 includes a NOR circuit 64, an inverter 65, and an nMOS transistor 66. The NOR circuit 64 performs a NOR operation on the output signal of the NOR circuit 64 and the output signal of the inverter 63. The inverter 65 inverts the output signal of the NOR circuit 64. The nMOS transistor 66 is turned ON and OFF in response to the output signal of the inverter 65. The pMOS transistor 58 and the nMOS transistor 59 are also turned ON and OFF in response to the output signal of the inverter 65.

The sense buffer 40 includes a NOR circuit 67, an inverter 68, and an nMOS transistor 69. The NOR circuit 67 performs a NOR operation on the output signal of the NOR circuit 60 and the output signal of the inverter 63. The inverter 68 inverts the output signal of the NOR circuit 67. The nMOS transistor 69 is turned ON and OFF in response to the output signal of the inverter 68. The pMOS transistor 52 and the nMOS transistor 53 are also turned ON and OFF in response to the output signal of the inverter 68.

When data on the global data bus lines GDB and /GDB is inverted at the time of reading, one of the current-mirror amplifier circuits 46 and 47 operates so that the read data DO is settled. Then, the current-mirror amplifier circuit which operates in the above process is disabled, while the other current-mirror amplifier circuit is enabled. In the above way, the sense buffer 40 is set to a standby mode ready to process a next data inversion occurring on the global data bus lines GDB and /GDB. That is, when the read data DO is alternately changed as indicated by "1"-→"0"-→"1"->"0", the current-mirror amplifier circuits 46 and 47 of the sense buffer 40 are alternately enabled one by one, so that a delay in accessing can be avoided.

Figure 6:
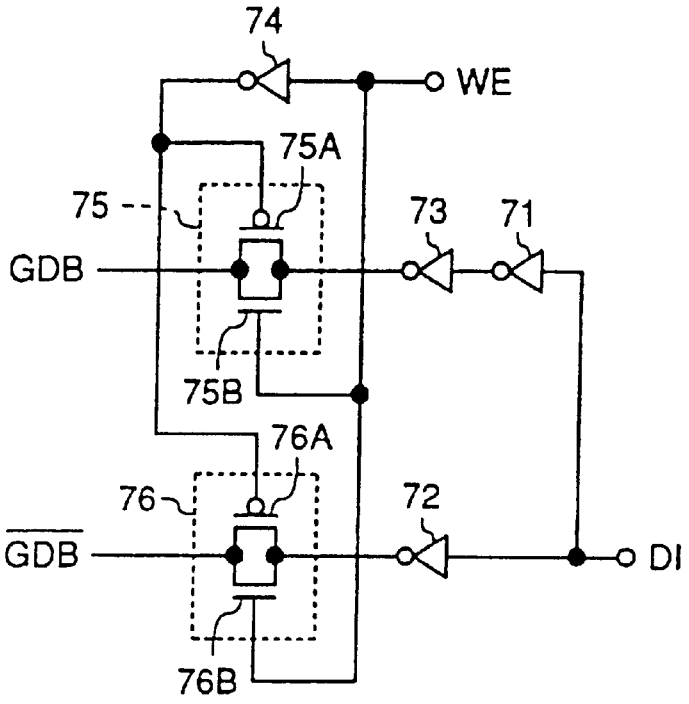
FIG. 6 is a circuit diagram of a write amplifier shown in FIG. 1.

FIG. 6 is a circuit diagram of the write amplifier 41, which includes inverters 71 and 72, which respectively inverts the write date DI. Further, the write amplifier 41 includes an inverter 73, which inverts the output signal of the inverter 71. A symbol "WE" is a write enable signal instructs the write operation. More particularly, the write enable signal WE is high when the write operation is instructed, and is low when the read operation is instructed. The write amplifier 41 includes an inverter 74, and transfer gates 75 and 76. The inverter 74 inverts the write enable signal WE. The transfer gate 75 includes a PMOS transistor 75A and an nMOS transistor 75B. The transfer gate 76 includes a pMOS transistor 76A and an nMOS transistor 76B. When the write enable signal WE is set to the high level, the transfer gates 75 and 76 are turned ON and enabled. When the write enable signal WE is set to the low level, the transfer gates 75 and 76 are turned OFF and disabled.

In the read operation of the SDRAM device, each of the sense amplifiers including the amplifiers 16 and 17 shown in FIG. 1 amplifies the potential difference between the corresponding pair of bit lines, the potential difference resulting from discharging of the selected memory cell. Then, the pair of bit lines of the selected column is connected to the pair of local data bus lines LDB and /LDB, and the selected pair of local data bus lines LDB and /LDB is connected to the pair of global data bus lines GDB and /GDB. In the above way, the data read from the selected memory cell is transferred, as complementary data signals, to the sense buffer 40 through the sense amplifier, the local data bus lines LDB and /LDB and the global data bus lines GDB and /GDB.

Figure 7A:
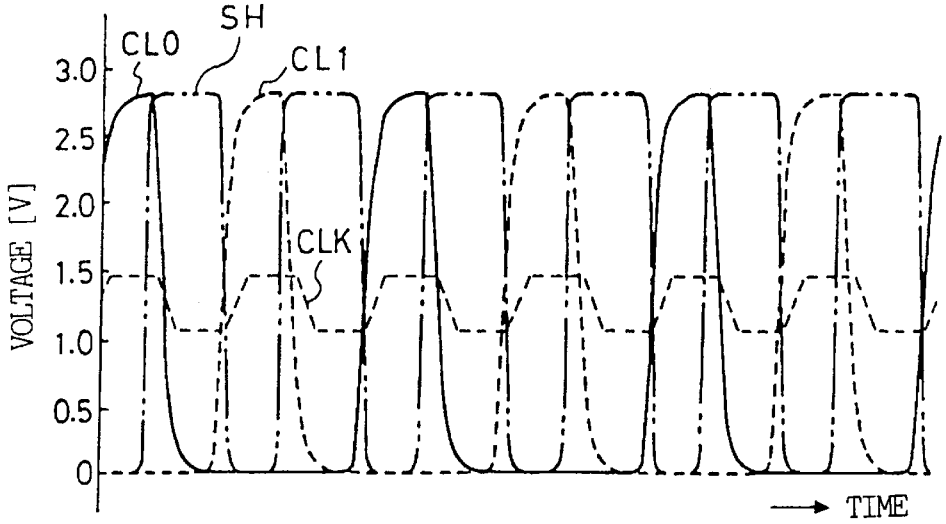
FIGS. 7A and 7B are waveform diagrams of a read operation of the SDRAM device shown in FIG. 1.
Figure 7B:
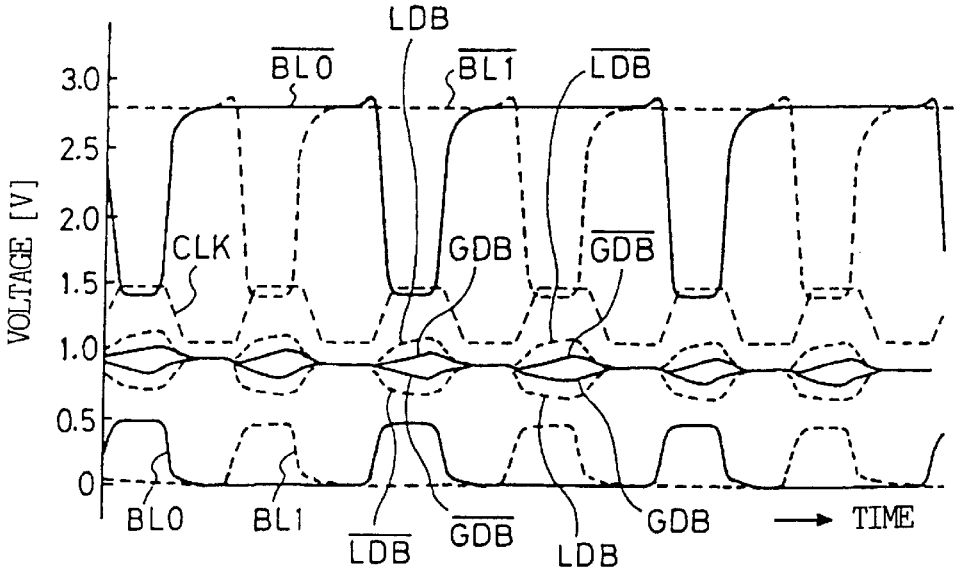

FIGS. 7A and 7B are waveform diagrams of an example of the read operation, in which outputting of "0" from the sense amplifier 16 and outputting of "1" from the sense amplifier are repeatedly performed. More particularly, FIG. 7A shows a voltage waveform of an external clock CLK supplied from an outside of the SDRAM device, voltage waveforms of the column selecting signals CL0 and CL1, and a voltage waveform of the shortcircuiting signal SH. FIG. 7B shows a voltage waveform of the external clock CLK, variations in the potentials of the bit lines BL0, /BL0, BL1 and /BL1, variations in the potentials of the local data bus lines LDB and /LDB, and variations in the potentials of the global data bus lines GDB and /GDB.

It can be seen from FIGS. 7A and 7B that high-speed read operation can be realized in which the read operation is continuously performed and data transfers of a small amplitude is carried out. When the read operation is performed once, the precharging transistor 39 is turned ON to thereby shortcircuit the global data bus lines GDB and /GDB in order to prevent a delay in the read operation in the next cycle. Hence, the global data bus lines GDB and /GDB as well as the selected local data bus lines LDB and /LDB are precharged to the precharge voltage VP.

In the write operation, the write data DI is translated into the complementary data signals by means of the write amplifier 41, which signals are transferred to the sense amplifier of the selected column via the global data bus lines GDB and /GDB and the selected local data bus lines LDB and /LDB. Then, the write data DI is finally written into the selected cell via the corresponding pair of bit lines.

Figure 8A:
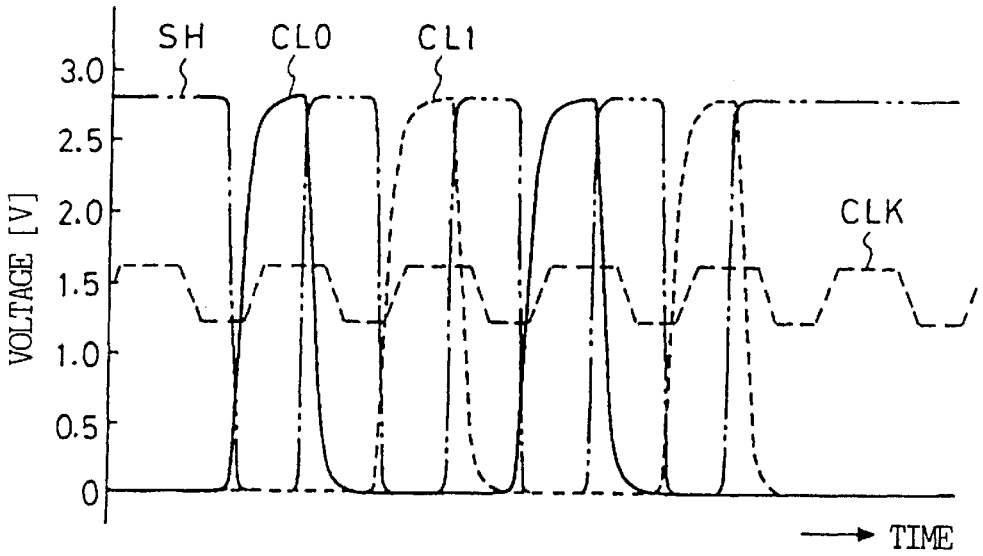
FIGS. 8A and 8B are waveform diagrams of a write operation of the SDRAM device shown in FIG. 1.
Figure 8B:
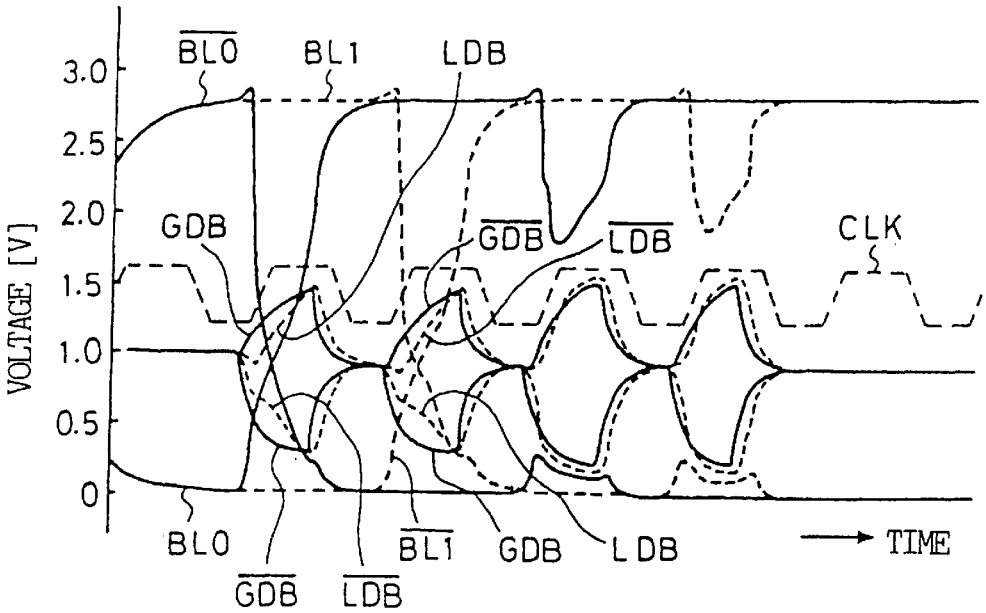

FIGS. 8A and 8B are waveform diagrams of an example of the write operation of the SDRAM device, and shows an operation in which, in a case where the sense amplifiers 16 and 17 respectively sense "0" and "1", (1) "1" is transferred to the sense amplifier 16, (2) "0" is then transferred to the sense amplifier 17, (3) "1" is transferred to the sense amplifier 16, and (4) "0" is transferred to the sense amplifier 17. More particularly, FIG. 8A shows a voltage waveform of the external clock CLK, voltage waveforms of the column selecting signals CL0 and CL1, and a voltage waveform of the shortcircuiting signal SH. FIG. 8B shows a voltage waveform of the external clock CLK, variations in the potentials of the global data bus lines GDB and /GDB, variations in the voltages of the local data bus lines LDB and /LDB, and variations in the voltages of the bit lines BL0, /BL0, BL1 and /BL1.

The greater the potential difference between the complementary data signals to be output to the global data bus lines GDB and /GDB from the write amplifier 41, the higher the write operation can be performed. When the write operation is performed once, the precharging transistor 39 is turned ON, as in the case of the read operation, in order to avoid the write operation in the next cycle from being prevented. Hence, the global data bus lines GDB and /GDB are shortcircuited, so that the global data bus lines GDB and /GDB and the local data bus lines LDB and /LDB are precharged to the precharged voltage VP.

The following means may contribute to reducing the operation cycle and speeding up of the operation of the above SDRAM device. That is, when taking into account the driving capability of the sense amplifier, it is necessary to completely precharge, at the time of reading data, the local data bus lines LDB and /LDB and the global data bus lines GDB and /GDB to the precharge voltage VP and then transfer data ensured by the sense amplifier to the local data buses LDB and /LDB.

In the SDRAM device, as shown in FIGS. 7A, 7B, 8A and 8B, the timing at which the global data bus lines GDB and /GDB are shortcircuited to precharge them is made to coincide with the shortcircuiting period. Hence, it is necessary to determine the period of shortcircuiting the global data bus lines GDB and /GDB on the basis of the data read timing. However, if the period for shortcircuiting is determined in the above way, when writing data, the global data bus lines GDB and /GDB are shortcircuited before the complementary data signals output to the global data bus lines GDB and /GDB from the write amplifier 41 have a sufficient potential difference. This prevents speeding up of the read and write operations.

In the read operation of the above SDRAM device, data is transferred via the selected sense amplifier, the selected local data bus lines LDB and /LDB, the global data bus lines GDB and /GDB, and the sense buffer 40 in this order. In the write operation, data is transferred via the write amplifier 41, the global data bus lines GDB and /GDB, the selected local data bus lines LDB and /LDB and the selected sense amplifier in this order.

The precharging transistor 39 is disposed so as to short-circuit the global data bus lines GDB and /GDB at a position close to the input terminals of the sense buffer 40, that is, the output terminals of the write amplifier 41. That is, the precharging transistor 39 is located at a position far from the sense amplifier which is a driver for transferring data in the read operation, and is located at a position close to the write amplifier which is a driver for transferring data in the write operation.

The inventors took into consideration the above and found the following fact through the research and experiments. When the operation cycle is made short, the read operation can be performed at a higher speed by sufficiently performing the shortcircuiting operation on the global data bus lines GDB and /GDB and then performing the data transfer operation. On the other hand, the write operation can be performed at a higher speed by releasing the global data bus lines GDB and /GDB from the shortcircuited state before these lines are sufficiently shortcircuited and then inverting data on the global data bus lines GDB and /GDB and the selected local data bus lines LDB and /LDB due to the driving capability of the write amplifier 41 itself.

The present invention is based on the above fact found by the inventors. More particularly, the present invention is directed to a method and circuit for shortcircuiting global data transfer lines of a semiconductor memory device in which complementary data signals are transmitted over the transfer lines in order to write data in a memory cell array or read data therefrom. Further, the present invention is directed to a semiconductor memory device having such a circuit.

A description will be given of embodiments of the present invention which are SDRAM devices including a circuit for shortcircuiting data transfer lines.

Figure 9:
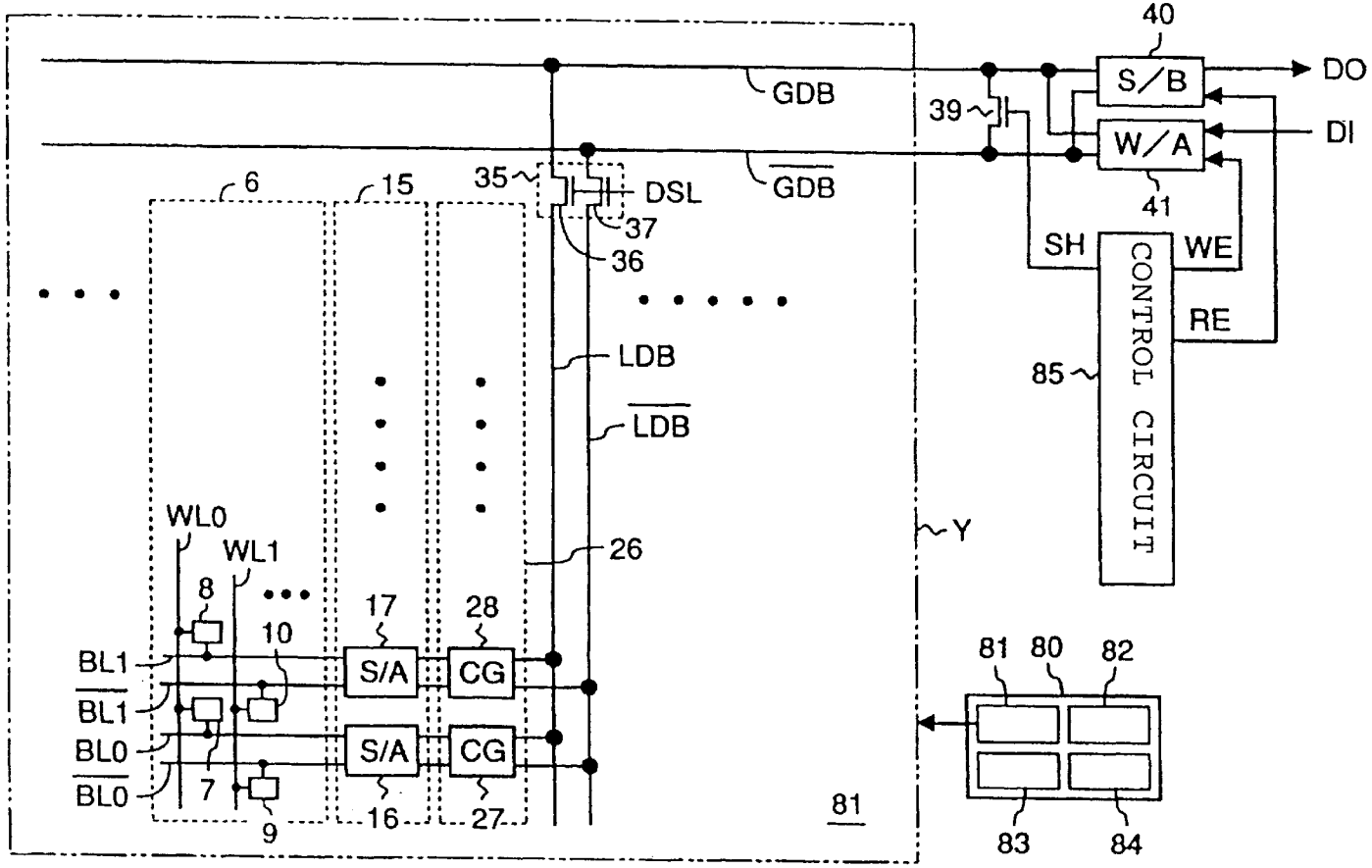
FIG. 9 is a block diagram of a SDRAM device according to embodiments of the present invention.

FIG. 9 is a block diagram of a first embodiment of the present invention. In FIG. 9, parts that are the same as those previously described are given the same reference numbers. The SDRAM device shown in FIG. 9 has a chip main body 80 having memory cell areas 81–84. A block depicted by a two-dot chained line is an enlarged portion of the memory cell area 81 and part of a peripheral circuit of the area 81.

The memory cell areas 81–84 have the same circuit configuration as the memory cell areas 2–5 shown in FIG. 1. An essential feature of the first embodiment of the present invention is to have a control circuit 85.

Figure 10:
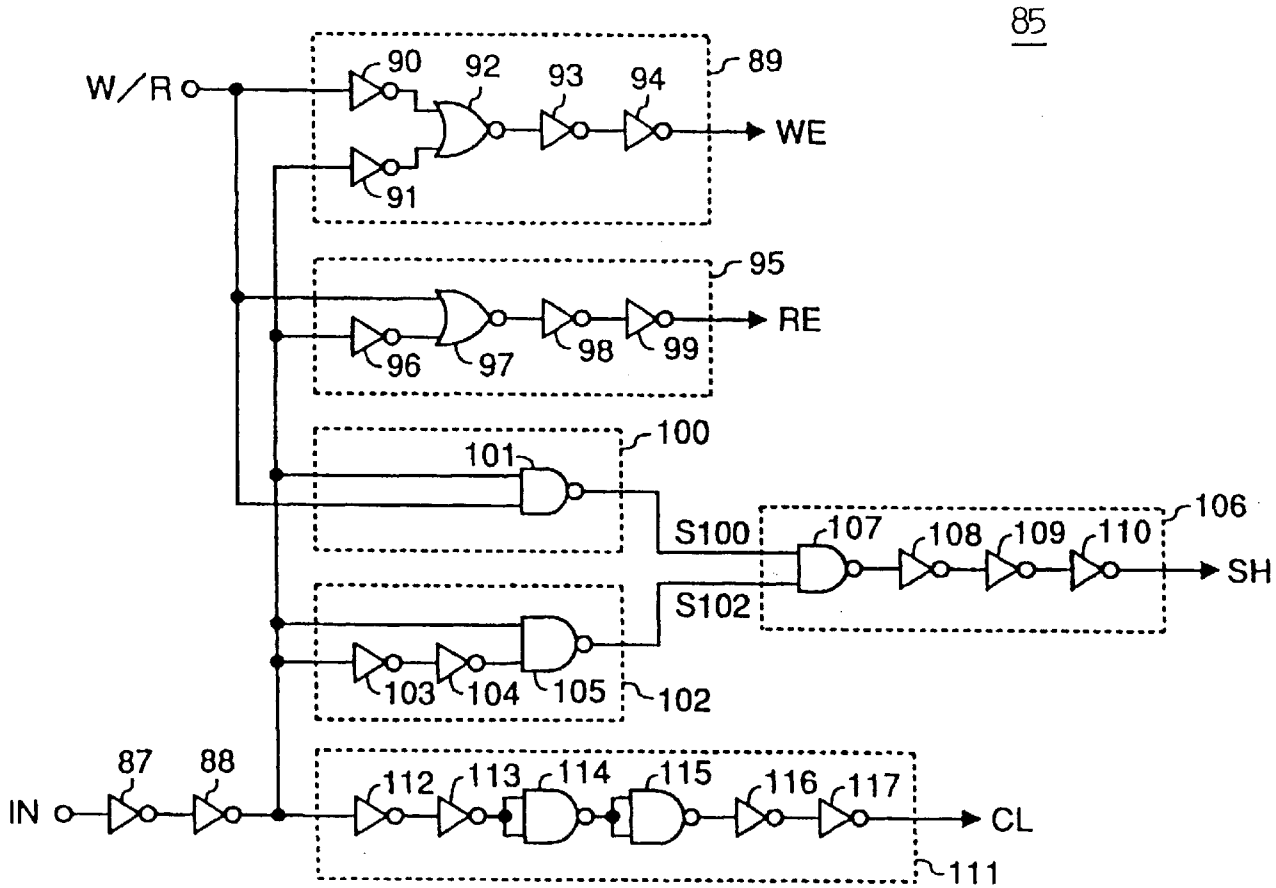
FIG. 10 is a block diagram of a control circuit shown in FIG. 9.

FIG. 10 is a block diagram of a structure of the control circuit 85. A write/read indication signal W/R and a timing signal IN are applied to the control circuit 85. The write/read indication signal W/R indicates whether the write operation or the read operation is now in progress. The timing signal IN is synchronized with the external clock signal CLK supplied from the outside of the SDRAM device. The control circuit 85 includes inverters 87 and 88 connected in series. The control circuit 85 includes a write enable controller 89, a read enable controller 95, a write-time shortcircuiting controller 100, a read-time shortcircuiting controller 102, a shortcircuiting controller 106, and a column controller 111.

The write enabling controller 89 outputs the write enable signal WE to control the enabling/disabling of the write amplifier 41. The controller 89 includes inverters 90, 91, 93 and 94, and a NOR circuit 92. The inverter 90 inverts the write/read indication signal W/R. The inverter 91 inverts the output signal of the inverter 88. The NOR circuit 92 performs a NOR operation on the output signals of the inverters 90 and 91. The inverter 93 inverts the output signal of the NOR circuit 92. The inverter 94 inverts the output signal of the inverter 93, and outputs the write enable signal WE. The inverters 93 and 94 function as a delay circuit.

The read enabling controller 95 outputs the read enable signal RE to control the enabling/disabling of the sense buffer 40. The controller 95 includes inverters 96, 98 and 99 and a NOR circuit 97. The inverter 96 inverts the output signal of the inverter 88. The NOR circuit 97 performs a NOR operation on the write/read indication signal W/R and the output signal of the NOR circuit 96. The inverter 98 inverts the output signal of the NOR circuit 97. The inverter 99 inverts the output signal of the inverter 98 to thereby generate the read enable signal RE. The inverters 98 and 99 function as a delay circuit.

The write-time shortcircuiting controller 100 controls the timing at which the global data bus lines GDB and /GDB are shortcircuited at the time of writing data. The controller 100 includes a NAND circuit, which performs a NAND operation on the write/read indication signal W/R and the output signal of the inverter 88.

The read-time shortcircuiting controller 102 controls the timing at which the global data bus lines GDB and /GDB are shortcircuited at the time of reading data. The controller 102 includes inverters 103 and 104, and a NAND circuit 105. The inverter 103 inverts the output signal of the inverter 88. The inverter 104 inverts the output signal of the inverter 103. The NAND circuit 105 performs a NAND operation on the output signal of the inverter 88 and the output signal of the inverter 104. The inverters 103 and 104 function as a delay circuit.

The shortcircuiting controller 106 outputs the shortcircuiting signal SH to control the ON/OFF of the precharge transistor 39. The controller 106 includes a NAND circuit 107 and inverters 108–110. The NAND circuit 107 performs a NAND operation on an output signal S100 of the write-time shortcircuiting controller 100 and an output signal S102 of the read-time shortcircuiting controller 012. The inverter 108 inverts the output signal of the NAND circuit 107. The inverter 109 inverts the output signal of the inverter 108. The inverter 110 inverts the output signal of the inverter 109 to thereby generate the shortcircuiting signal SH. The inverters 108, 109 and 110 form an inverted delay circuit.

The column controller 111 outputs the column control signal CL to control the timing at which one column is selected. The controller 111 includes inverters 112, 113, 116 and 117, and NAND circuits 114 and 115. The inverter 112 inverts the output signal of the inverter 88. The inverter 113 inverts the output signal of the inverter 112. The NAND circuit 114 functions to inverts the output signal of the inverter 113. The NAND circuit 115 functions to invert the output signal of the NAND circuit 114. The inverter 116 inverts the output of the NAND circuit 115. The inverter 117 inverts the output signal of the inverter 117 and output the column control signal CL.

Figure 11A:
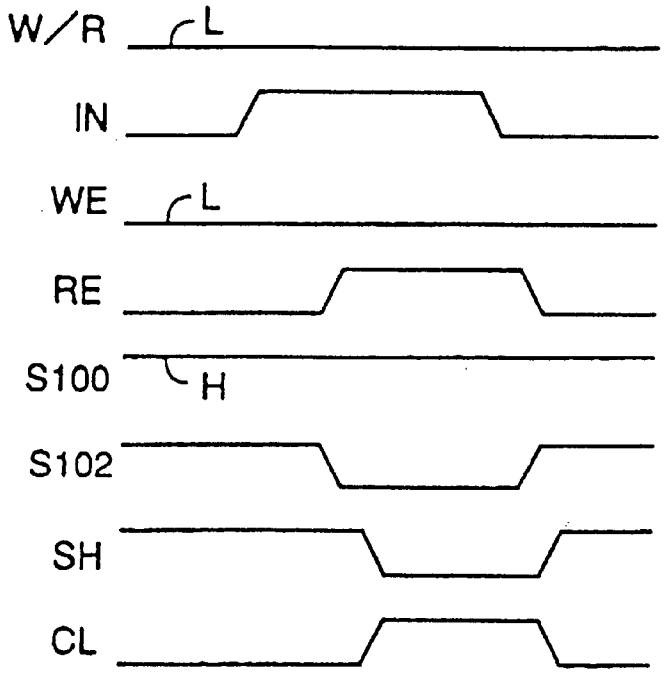
FIGS. 11A and 11B are waveform diagrams of an operation of the SDRAM device according to a first embodiment of the present invention.
Figure 11B:
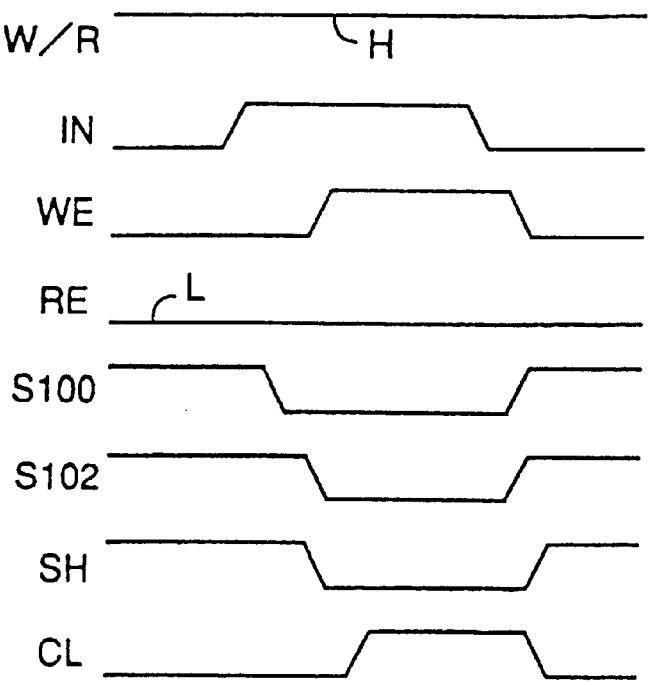

FIGS. 11A and 11B are waveform diagrams of the operation of the first embodiment of the present invention. More particularly, FIG. 11A shows a read operation, and FIG. 11B shows a write operation.

In the read operation, the write/read indication signal W/R is set to the low level. In this case, when the timing signal IN is low, the write enabling controller 89 operates as follows. The output signal of the inverter 90 is high, and the output signal of the inverter 91 is high. The output signal of the NOR circuit 92 is low, and the output signal of the inverter 93 is high. Hence, the write enable signal WE is low, and the write amplifier 41 is in the disabled (inactive) state. In the read enabling controller 95, the output signal of the inverter 96 is high, and the output signal of the NOR circuit 97 is low. The output signal of the inverter 98 is high and thus the read enable signal RE are low. Hence, the sense buffer 40 is in the disabled state.

The output signal S100 of the write-time shortcircuiting controller 100 becomes high. In the read-time shortcircuiting controller 102, the output signal of the inverter 103 is high and the output signal of the inverter 104 is low. Hence, the output signal S102 of the read-time shortcircuiting controller 102 is high. Hence, in the shortcircuiting controller 106, the output signal of the NAND circuit 107 is low, and the output signal of the inverter 108 is high. Further, the output signal of the inverter 109 is low. Thus, the shortcircuiting signal SH is high and the precharging transistor 39 is turned ON and the global data bus lines GDB and /GDB are set to the shortcircuited state.

In the column controller 111, the output signal of the inverter 112 is high, and the output signal of the inverter 113 is low. The output signal of the NAND circuit 114 is high, and the output signal of the NAND circuit 115 is low. The output signal of the inverter 116 is high, and thus the column control signal CL is low. Hence, the column is in the non-selected state.

If the timing signal IN becomes high from the above non-selected state, the write enabling controller 89 operates as follows. The output signal of the inverter 91 is low, while the output signal of the inverter 90 is high, and the output signal of the NOR circuit 92 is low. Further, the output signal of the inverter 93 is high, and hence the write enable signal WL is maintained at the low level. As a result, the disabled state of o the write amplifier 41 is maintained.

In the read enabling controller 95, the output signal of the inverter 96 is low, and the output signal of the NOR circuit 97 is high. The output signal of the inverter 98 is low, and the read enable signal RE is high. Hence, the sense buffer 40 is switched to the enabled state.

The output signal S100 of the write-time shortcircuiting controller 100 is maintained at the high level. In the read-time shortcircuiting controller 102, the output signal of the inverter 103 becomes low and the output signal of the inverter 104 becomes high. Hence, the output signal S102 of the read-time shortcircuiting controller 102 becomes low. Hence, in the shortcircuiting controller 106, output signal of the NAND circuit 107 is high, and the output level of the inverter 108 is low. The output of the inverter 109 is high, and shortcircuiting signal SH is switched to the low level. Hence, the precharging transistor 39 is turned OFF, and the global data bus lines GDB and /GDB are released from the shortcircuited state.

In the column controller 111, the output signal of the inverter 112 is low, and the output signal of the inverter 113 is high. The output signal of the NAND circuit 114 is low, and the output signal of the NAND circuit 115 is high. The output signal of the inverter 116 is low, and the column control signal CL is high. Hence, the column is selected.

The timing at which the shortcircuiting signal SH falls to the other levels is determined by the total of the delay times of the read-time shortcircuiting controller 102 and the shortcircuiting controller 106. The timing at which the level of the column control signal CL is determined by the delay time of the column controller 111. The total of the delay times of the read-time shortcircuiting controller 102 and the shortcircuiting controller 106 is approximately equal to the delay time of the column controller 111. Hence, the timing at which the level of the shortcircuiting signal SH substantially coincides with the timing at which the column control signal CL rises from the current level to the other level.

In the first embodiment of the present invention, the total of the delay times of the read-time shortcircuiting controller 102 and the shortcircuiting controller 106 is determined so that the releasing of the global data bus lines GDB and /GDB from the shortcircuited state is carried out after the global data bus lines GDB and /GDB and the selected local data bus lines LDB and /LDB are precharged to the precharged voltage VP. Thereafter, when the timing signal IN switches to the low level, the output signal of only the inverter 91 is inverted to the high level in the write enabling controller 89. That is, the output signals of the inverters 90 and 93 are maintained at the high level, and the output signal of the NOR circuit 92 and the write enable signal WE are maintained at the low level. Hence, the write amplifier 41 is maintained in the disabled state.

On the other hand, in the read activating controller 95, the output signal of the inverter 96 is high, and the output signal of the NOR circuit 97 is low. The output signal of the inverter 98 is high, and the read enable signal RE is low. Hence, the sense buffer 40 is switched to the disabled state.

The output signal S100 of the write-time shortcircuiting controller 100 is maintained at the high level, while the output signal S102 of the read-time shortcircuit controller 102 is switched to the high level. Hence, the shortcircuiting controller 106 operates as follows. The output signal of the NAND circuit 107 is low, and the output signal of the inverter 108 is high. The output signal of the inverter 109 is low, and the shortcircuiting signal SH is high. Hence, the shortcircuiting transistor 39 is turned ON and the global data bus lines GDB and /GDB are thus shortcircuited and precharged.

In the column controller 111, the output signal of the inverter 112 is high, and the output signal of the inverter 113 is low. The output signal of the NAND circuit 1143 is high, and the output signal of the NAND circuit 115 is low. The output signal of the inverter 116 is high, and the column control signal CL is low. Hence, the selection of the column is terminated. The timing at which the level of the shortcircuiting signal SH increases substantially coincides with the timing at which the level of the column control signal CL decreases.

A description will now be given of the write operation of the first embodiment of the present invention.

In the write operation, the write/read indication signal W/R is switched to the high level.

In this case, when the timing signal IN is low, the write enabling controller 89 operates as follows. The output signal of the inverter 90 is low, and the output signal of the inverter 91 is high. The output signal of the NOR circuit 92 is low, and the output signal of the inverter 93 is high. Thus, the write enable signal WE is switched to the low level, and the write amplifier 41 is set to the disabled state.

In the read enabling controller 95, the output signal of the inverter 96 is low, and the output signal of the NOR circuit 97 is low. The output signal of the inverter 98 is high, and the read enable signal RE is low. Hence, the sense buffer 40 is set to the disabled state.

The output signal S100 of the write-time shortcircuit controller 100 is switched to the high level. In the read-time shortcircuiting controller 102, the output signal of the inverter 103 is high, and the output signal of the inverter 104 is low. Hence, the output signal S102 of the read-time shortcircuiting controller 102 is switched to the high level. Hence, in the shortcircuiting controller 106, the output signal of the NAND circuit 107 is low, and the output signal of the inverter 108 is high. The output signal of the inverter 109 is low, and the shortcircuiting signal SH is high. Hence, the precharging transistor 39 is turned ON, and the global data bus lines GDB and /GDB are thus set to the shortcircuited state.

In the column controller 111, the output signal of the inverter 112 is high, and the output signal of the inverter 113 is low. The output signal of the NAND circuit 114 is high, and the output signal of the NAND circuit 115 is low. The output signal of the inverter 116 is high, and the column control signal CL is low. Hence, the column is switched to the disabled state.

When the timing signal IN becomes high from the above disabled state, the write enabling controller 89 operates as follows. The output signal of the inverter 91 is low, and the output signal of the NOR circuit 92 is high. The output signal of the inverter 93 is low, and the write enable signal WE is high. Hence, the write amplifier 41 is set to the enabled state.

The read enabling controller 95 operates as follows. Although the output signal of the inverter 96 is low, the write/read indication signal W/R is maintained at the high level. Hence, the output signal of the NOR circuit 97 is low, and the output signal of the inverter 98 is high. Thus, the read enable signal RE is maintained at the low level, and the disabled state of the sense buffer 40 is continuously held.

The output signal S100 of the write-time shortcircuiting controller 100 is switched to the low level. Hence, in the shortcircuiting controller 106, the output signal of the NAND circuit 107 is high, and the output signal of the inverter 108 is low. The output signal of the inverter 109 is high, and the shortcircuiting signal SH is low. Hence, the shortcircuiting transistor 39 is turned OFF, and the global data bus lines GDB and /GDB are released from the shortcircuited state.

In the read-time shortcircuiting controller 102, the output signal of the inverter 103 is switched to the low level and the output signal of the inverter 104 is switched to the high level. Hence, the output signal S102 of the read-time shortcircuiting controller 102 is switched to the low level.

In the column controller 111, the output signal of the inverter 112 is low, and the output signal of the inverter 113 is high. The output signal of the NAND circuit 114 is low, and the output signal of the NAND circuit 115 is high. The output signal of the inverter 116 is low, and the column control signal CL is high. Hence, the column is selected.

The timing at which the shortcircuiting signal SH falls to the other level is determined by the total of the delay times of the write-time shortcircuiting controller 100 and the shortcircuiting controller 106. The timing at which the column control signal CL falls to the other level is determined by the delay time of the column controller 111. In this case, the total of the delay times of the write-time shortcircuiting controller 100 and the shortcircuiting controller 106 is shorter than the delay time of the column controller 111. Hence, the timing at which the shortcircuiting signal SH falls leads to the timing at which the column control signal CL rises from the current level to the other level.

In the first embodiment of the present invention, the total of the delay times of the write-time shortcircuiting controller 100 and the shortcircuiting controller 106 is determined so that the timing at which the shortcircuiting signal SH falls to the other level occurs before the global data bus liens GDB and /GDB and the selected local data bus lines LDB and /LDB are completely precharged to the precharge voltage VP. Further, the delay time of the write enabling controller 89 is determined so that the write operation is started at the same time as the shortcircuiting transistor 39 is turned OFF.

Even in the above operation, it is possible to have a large driving capability of the write amplifier 41 and is possible for the write amplifier 41 to invert the data on the global data bus lines GDB and /GDB and the selected local data bus lines LDB and /LDB.

Thereafter, when the timing signal IN becomes low, the write enabling controller 89 operates as follows. The output signal of the inverter 91 is high, and the output signal of the NOR circuit 92 is low. The output signal of the inverter 93 is high, and the write enable signal WE is low and therefore the write amplifier 41 is switched to the disabled state.

In the read enabling controller 95, the output signal of only the inverter 96 is inverted. That is, the output signal of the inverter 98 is maintained at the high level, while the output signal of the NOR circuit 97 and the read enable signal RE are maintained at the low level. Thus, the sense buffer 40 is maintained in the disabled state.

Further, the output signal S100 of the write-time shortcircuiting controller 100 is switched to the high level, and the output signal S102 of the read-time shortcircuiting controller 102 is switched to the high level. Hence, in the shortcircuiting controller 106, the output signal of the NAND circuit 107 is low, and the output signal of the inverter 108 is high. The output signal of the inverter 109 is low, and the shortcircuiting signal SH is high. Hence, the shortcircuiting transistor 39 is turned ON, and the global data bus lines GDB and /GDB are switched to the shortcircuited state and are thus precharged.

In the column controller 111, the output signal of the inverter 112 is high, and the output signal of the inverter 113 is low. The output signal of the NAND circuit 114 is high, and the output signal of the NAND circuit 115 is low. The output signal of the inverter 116 is high, and the column control signal CL is low. Hence, the selection of the column is terminated. The timing at which the shortcircuiting signal SH rises to the other level substantially coincides with the timing at which the column control signal CL falls to the other level.

FIGS. 12A through 12E are waveform diagrams of a simulation of an example of the operation of the first embodiment of the present invention. In the write operation, the sense amplifier 16 is made to sense data "0" and the sense amplifier 17 is made to sense data "1". Thereafter, data "1" is written into the sense amplifier 16, and subsequently reading of "0" from the sense amplifier 17 and reading of "1" from the sense amplifier 16 are alternately carried out.

Figure 12A:
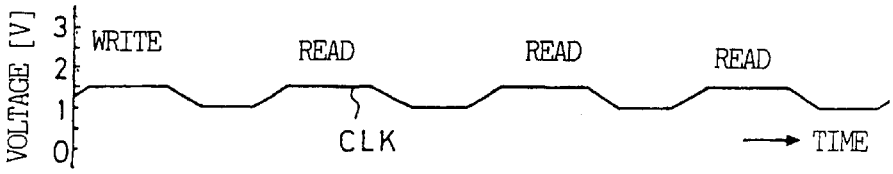
FIGS. 12A, 12B, 12C, 12D and 12E are waveform diagrams of the results of a simulation of the operation of the SDRAM device according to the first embodiment of the present invention.
Figure 12B:
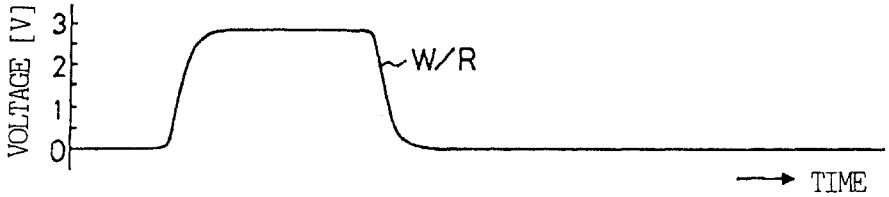
Figure 12C:
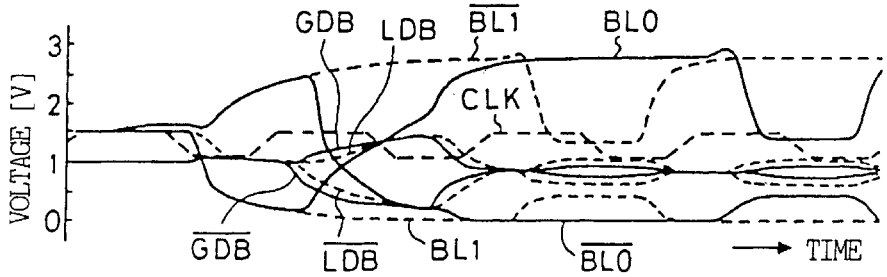
Figure 12D:
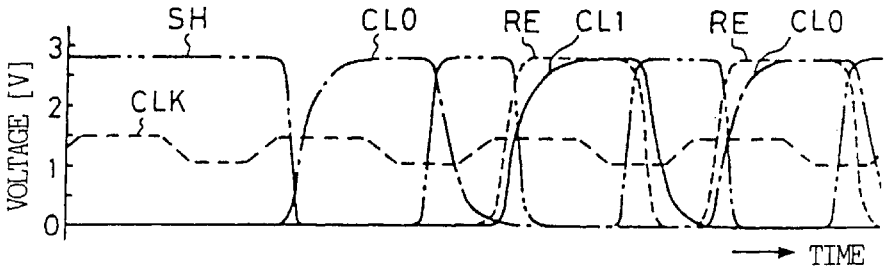
Figure 12E:
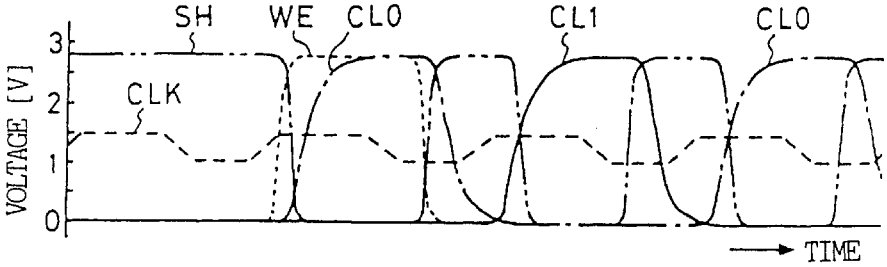

FIG. 12A shows a voltage waveform of the external clock CLK, and FIG. 12B shows a voltage waveform of the write/read indication signal W/R. FIG. 12C shows a voltage waveform of the external clock CLK, variations in the potentials of the bit lines BL0, /BL0, BL1 and /BL1, variations in the potentials of the local data bus lines LDB and /LDB, and variations in the potentials of the global data bus lines GDB and /GDB. FIG. 12D shows a voltage waveform of the external clock CLK, a voltage waveform of the shortcircuiting signal SH, voltage waveforms of the column selecting signals CL0 and CL1, and a voltage waveform of the read enable signal RE. FIG. 12E shows a voltage waveform of the external clock CLK, a voltage waveform of the shortcircuiting signal SH, voltage waveforms of the column selecting signals CL0 and CL1, a voltage waveform of the write enable signal WE.

It can be seen from the operation cycles shown in FIGS. 12A through 12E that the global data bus lines GDB and /GDB are released from the shortcircuited state in the write operation in advance of releasing these bus lines from the shortcircuited state in the read operation. This is one of the essential features of the first embodiment of the present invention.

Hence, it is possible to avoid the following problem and to reduce the operation cycle and speed up the read and write operations. That is, even in the case where in the read operation, the selected local data bus lines LDB and /LDB and the global data bus lines GDB and /GDB are completely precharged to the precharge voltage VP and thereafter data captured by the sense amplifier is transferred to the local data bus lines, it is possible to avoid a situation in which the global data bus lines GDB and /GDB are shortcircuited in the write operation before the complementary signals output to the global data bus lines GDB and /GDB from the write amplifier 41 have a sufficient potential difference.

The much faster write operation can be carried out by the write amplifier 41 equipped with a driving capability of precharging the global data bus lines GDB and /GDB to the precharge voltage VP in advance of precharging by the shortcircuiting transistor 39 and the precharging circuit 43 which are the original precharging means.

A description will now be given, with reference FIGS. 13, 14A and 14B, of a second embodiment of the present invention, which is intended to be equipped with a control circuit shown in FIG. 13, which should be substituted for the control circuit 85 shown in FIG. 10. The other parts of the second embodiment of the present invention are the same as those of the first embodiment thereof.

Figure 13:
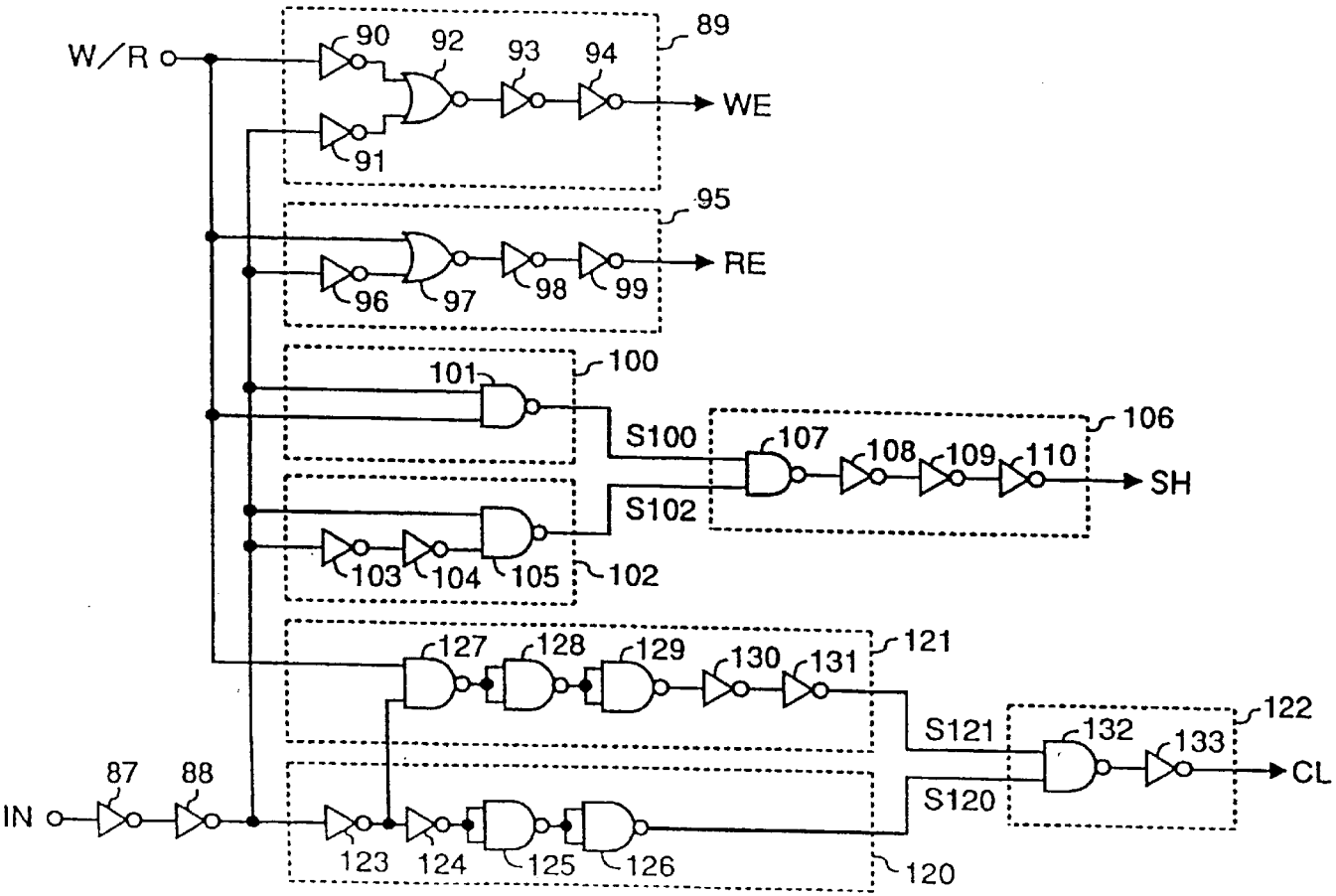
FIG. 13 is a block diagram of a control circuit provided in an SDRAM device according to a second embodiment of the present invention.

The control circuit shown in FIG. 13 is equipped with a read-time column controller 120, a write-time column controller 121 and a column controller 122, which are substituted for the column controller 111 shown in FIG. 10. The other parts of the control circuit shown in FIG. 13 are the same as those of the control circuit shown in FIG. 10.

The read-time column controller 120 controls the timing at which the column control signal CL rises to the other level in the read operation, and is made up of inverters 123 and 124 and NAND circuits 125 and 126. The inverter 123 inverts the output signal of the inverter 88. The inverter 124 inverts the output signal of the inverter 123. The NAND circuit 125 functions as an inverter which inverts the output signal of the inverter 124. The NAND circuit 126 functions as an inverter which inverts the output signal of the NAND circuit 125.

The write-time column controller 121 controls the timing at which the column signal rises to the other level in the read operation, and it made up of NAND circuits 127–129 and inverters 130 and 131. The NAND circuit 127 performs a NAND operation on the output signals of the write/read indication signal W/R and the inverter 123. The NAND circuit 128 functions as an inverter which inverts the output signal of the NAND circuit 127. The NAND circuit 129 functions as an inverter which inverts the output signal of the NAND circuit 128. The inverter 130 inverts the output signal of the NAND circuit 129. The inverter 131 inverts the output signal of the inverter 130.

The column controller 122 outputs the column selecting signal CL to thereby control the column selecting operation, and is made up of a NAND circuit 132 and an inverter 133. The NAND circuit 132 performs a NAND operation on an output signal S120 of the read-time column controller 120 and an output signal of the write-time column controller 121. The inverter 133 inverts the output signal of the NAND circuit 132 to thereby output the column control signal CL.

Figure 14A:
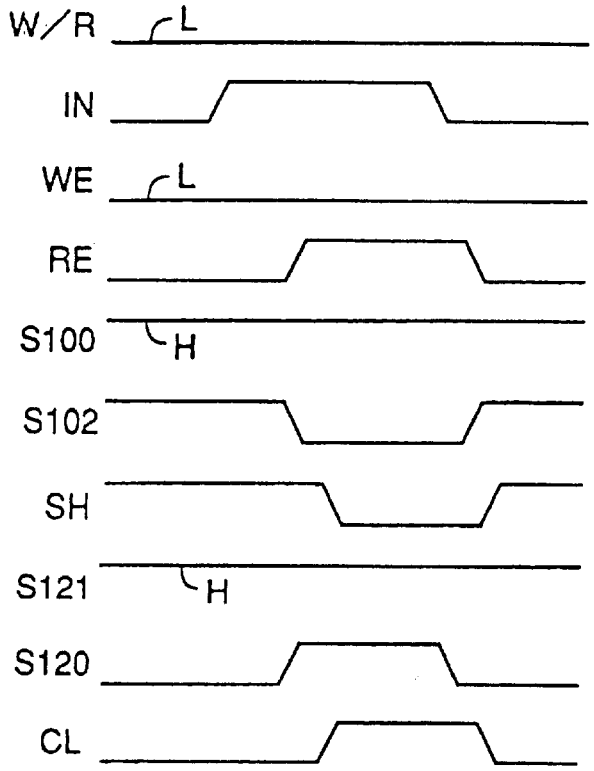
FIGS. 14A and 14B are waveform diagrams of an operation of the second embodiment of the present invention.
Figure 14B:
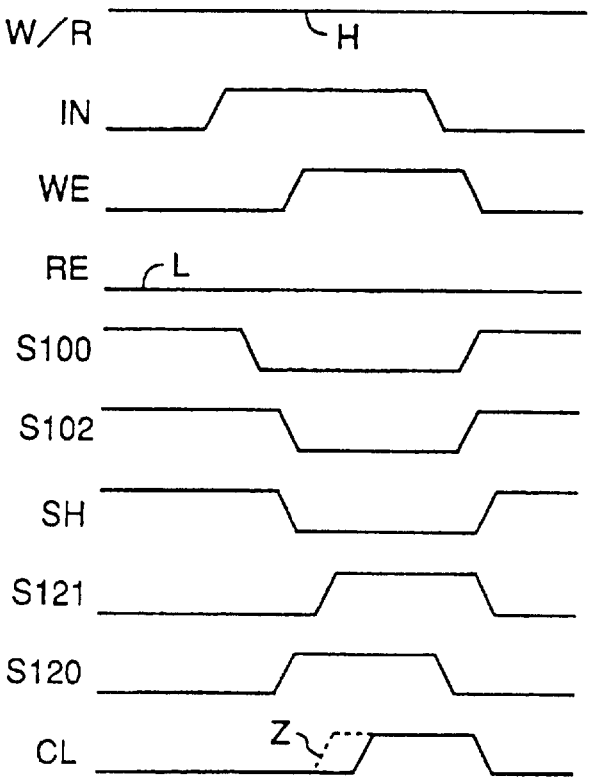

FIGS. 14A and 14B are waveform diagrams of an operation of the second embodiment of the present invention. More particularly, FIG. 14A shows a read operation, and FIG. 14B shows a write operation. The write enabling controller 89, the read enabling controller 95, the write-time shortcircuiting controller 100, the read-time shortcircuiting controller 102 and the shortcircuiting controller 106 of the second embodiment of the present invention operate in the same manner as those of the first embodiment of the present invention.

In the read operation, the write/read indication signal W/R is set to the low level. In this case, when the timing signal IN is low, the read-time column controller 120 operates as follows. The output signal of the inverter 123 is high, and the output signal of the inverter 124 is low. The output signal of the NAND circuit 125 is high, and the output signal S120 of the read-time column controller 120 is low.

In the write-time column controller 121, the output signal of the NAND circuit 127 is high, and the output signal of the NAND circuit 128 is low. The output signal of the NAND circuit 129 is high, and the output signal of the inverter 130 is low. Thus, the output signal S121 of the write-time column controller 121 is high. Hence, the output signal of the NAND circuit 132 is high and the column control signal CL is low.

When the timing signal switches to the high level from the above state, the read-time column controller 120 operates as follows. The output signal of the inverter 123 is low, and the output signal of the inverter 124 is high. The output signal of the NAND circuit is low, and the output signal S120 of the read-time column controller 120 is high.

In the write-time column controller 121, the output signal of the NAND circuit 127 is high, and the output signal of the NAND circuit 128 is low. The output signal of the NAND circuit 129 is high, and the output signal of the inverter 130 is low. Hence, the output signal S121 of the write-time column controller 121 is maintained at the high level. Hence, the output signal of the NAND circuit 132 of the column controller 122 is switched to the low level and the column control signal CL is switched to the high level.

The timing at which the column control signal CL rises to the other level is determined by the total of the delay times of the read-time column controller 120 and the column controller 122. The total of the read-time column controller 120 and the column controller 122 is approximately equal to the total of the delay times of the read-time shortcircuiting controller 102 and the shortcircuiting controller 106. Hence, the timing at which the column controller signal CL rises to the other level substantially coincides with the timing obtained in the first embodiment of the present invention.

Thereafter, when the timing signal IN becomes low, the read-time column controller 120 operates as follows. The output signal of the inverter 123 is high, and the output signal of the inverter 124 is low. The output signal of the NAND circuit 125 is high, and the output signal S120 of the read-time column controller 120 is low. Hence, the output signal of the NAND circuit 132 of the column controller 122 is high, and the column control signal CL is low. The timing at which the column control signal CL falls is almost the same as that of the first embodiment of the present invention.

In the write-time column controller 121, the output signal of the NAND circuit 127 is high, and the output signal of the NAND circuit 128 is low. The output signal of the NAND circuit 129 is high, and the output signal of the inverter 130 is low. Thus, the output signal S121 of the write-time column controller 121 is maintained at the high level.

In the write operation, the write/read indication signal W/R is set to the high level. In this case, when the timing signal IN is at the low level, the read-time column controller 120 operates as follows. The output signal of the inverter 123 is high, and the output signal of the inverter 124 is low. The output signal of the NAND circuit 125 is high, and the output signal S120 of the read-time column controller 120 is low.

In the write-time column controller 121, the output signal of the NAND circuit 127 is low, and the output signal of the NAND circuit 128 is high. The output signal of the NAND circuit 129 is low, and the output signal of the inverter 130 is high. Thus, the output signal S121 of the write-time column controller 121 is low. Hence, in the column controller 122, the output signal of the NAND circuit 132 is low, and the column control signal CL is low.

When the timing signal IN becomes high from the above state, the read-time column controller 120 operates as follows. The output signal of the inverter 123 is low and the output signal of the inverter 124 is high. The output signal of the NAND circuit 125 is low and the output signal S120 of the read-time column controller 120 is high.

In the write-time controller 121, the output signal of the NAND circuit 127 is high and the output signal of the NAND circuit 128 is low. The output signal of the NAND circuit 129 is high, and the output signal of the inverter 130 is low. Hence, the output signal S121 of the write-time column controller 121 is high. Hence, in the column controller 122, the output signal of the NAND circuit 132 is low and the column control signal CL is high.

It will be noted that the output signal S121 of the write-time column controller 121 is switched to the high level with a delay equal to the total of the delay time of one NAND circuit and the delay time of one inverter after the output signal S120 of the read-time column controller 120 is switched to the high level. Hence, the timing at which the column control signal CL is switched to the low level is delayed as compared to the timing of the first embodiment of the present invention. The broken line Z shown in FIG. 14B indicates the column control signal CL used in the first embodiment of the present invention.

Thereafter, when the timing signal IN becomes low, the read-time column controller 120 operates as follows. The output signal of the inverter 123 is high and the output signal of the inverter 124 is low. The output signal of the NAND circuit 125 is high, and the output signal S120 of the read-time column controller 120 is low. Hence, in the column controller 122, the output signal of the NAND circuit 132 is high, and the column control signal CL is low.

In the write-time column controller 121, the output signal of the NAND circuit is low and the output signal of the NAND circuit 128 is high. The output signal of the NAND circuit 129 is low and the output signal of the inverter 130 is high. Hence, the output signal S121 of the write-time column controller 121 is low. The timing at which the signal S121 become low lags behind the timing at which the output signal S120 of the read-time column controller 120 becomes low. Hence, the timing at which the column control signal CL becomes low substantially coincides with that of the first embodiment of the present invention.

In the first embodiment of the present invention, if the chip size is large and the data transfer lines are long, the column gate may be selected before the complementary data signals output to the global data bus lines GDB and /GDB from the write amplifier 41 reach the selected column gate. In this case, if the data captured by the sense amplifier of the selected column has the inverted relationship with the data to be written into the selected memory cell, two pairs of complementary signals having the inverted relationship collide on the selected pair of local data bus lines. This collision may cause a delay in signal transfer.

With the above in mind, in the second embodiment of the present invention, the timing at which the column control signal CL rises is designed to lag behind the corresponding timing of the first embodiment of the present invention. Hence, it is possible to settle the potentials of the selected pair of local data bus lines and thereafter write data into the sense amplifier of the selected column.

Hence, it is possible to avoid the following problems and to reduce the operation cycle and speed up the read and write operations. That is, even in the case where the read operation, the selected local data bus lines LDB and /LDB and the global data bus lines GDB and /GDB are completely precharged to the precharge voltage VP and thereafter data captured by the sense amplifier is transferred to the local data bus lines, it is possible to avoid a situation in which the global data bus lines GDB and /GDB are shortcircuited in the write operation before the complementary signals output to the global data bus lines GDB and /GDB from the write amplifier 41 have a sufficient potential difference. Further, it is possible to avoid a delay in data transfer due to a collision of the complementary data signals output to the global data bus lines GDB and /GDB from the write amplifier 41 and the complementary data signals output from the sense amplifier and to thereby speed up the read and write operations.

A description will now be given, with reference to FIGS. 15, 16A and 16B, of a third embodiment of the present invention, which is equipped with a control circuit shown in FIG. 15 instead of the control circuit 85 shown in FIG. 10. The other parts of the third embodiment of the present invention are the same as those of the first embodiment of the present invention.

Figure 15:
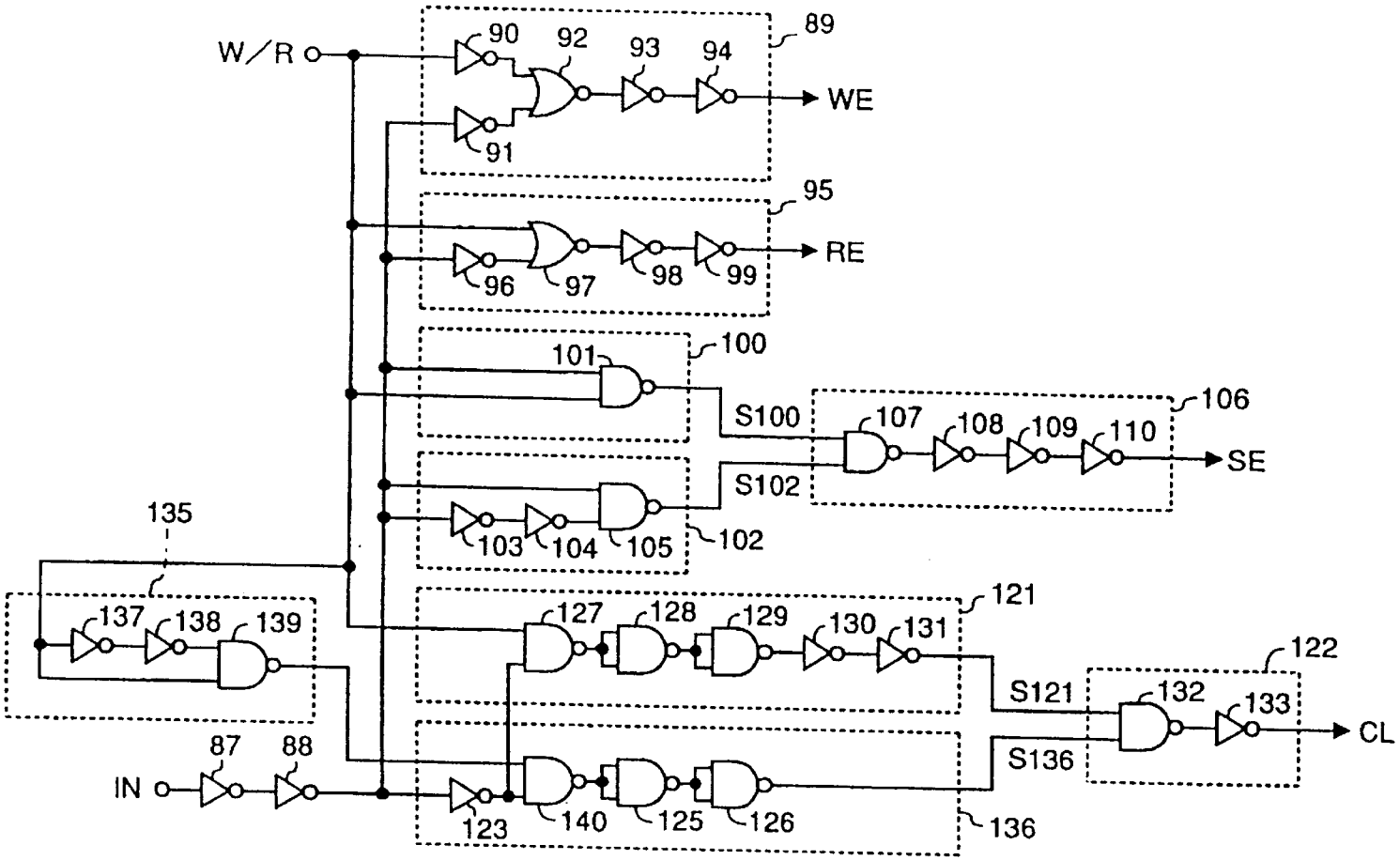
FIG. 15 is a block diagram of a control circuit provided in an SDRAM device according to a third embodiment of the present invention.

The control circuit shown in FIG. 15 has a write controller 135, and is equipped with a read-time column controller 136 having a different configuration from that of the read-time column controller 120 shown in FIG. 13. The other parts of the control circuit shown in FIG. 15 are the same as those of the control circuit shown in FIG. 13.

A case will now be assumed in which the timing at which the column control signal CL falls to the other level in the write operation is delayed to ensure a sufficient write time. In this case, if the control circuit shown in FIG. 13 is used, it is necessary to delay the timing at which the output signal S120 of the read-time column controller 120 falls. In this case, a problem may be caused in which the column control signal CL rises to the other level from the current level. The third embodiment of the present invention is directed to eliminating the above problem.

The write controller 135 includes inverters 137 and 138 and a NAND circuit 139. The inverter 137 inverts a word/read indication signal W/R. The inverter 138 inverts the output signal of the inverter 137. The NAND circuit 139 performs a NAND operation on the output signal of the inverter 138 and the word/read indication signal W/R. A delay circuit is formed by the inverters 137 and 138.

When the operation mode of the memory device is switched from the read mode to the write mode, the write controller 135 outputs the inverted version of the word/read indication signal W/R with a delay equal to the sum of the delay times of the inverters 137 and 138 and the NAND circuit 139. The output signal of the write controller 135 is supplied to the read-time column controller 136. When the operation mode is switched from the write mode to the read mode, the write controller 135 supplies the read-time column controller 136 with the word/read indication signal W/R with the delay time of the NAND circuit 139.

The read-time column controller 136 has a NAND circuit 140, which is substituted for the inverter of the read-time column controller 120 shown in FIG. 13. The NAND circuit 140 performs a NAND operation on the output signal of the inverter 123 and the output signal of the write controller 135. The output signal of the NAND circuit 140 is supplied to the NAND circuit 125. The other parts of the read-time column controller 136 are the same as those of the read-time column controller 120. The NAND circuits 125 and 126 form a delay circuit, and the NAND circuits 128 and 129 and inverters 130 and 131 form another delay circuit.

Figure 16A:
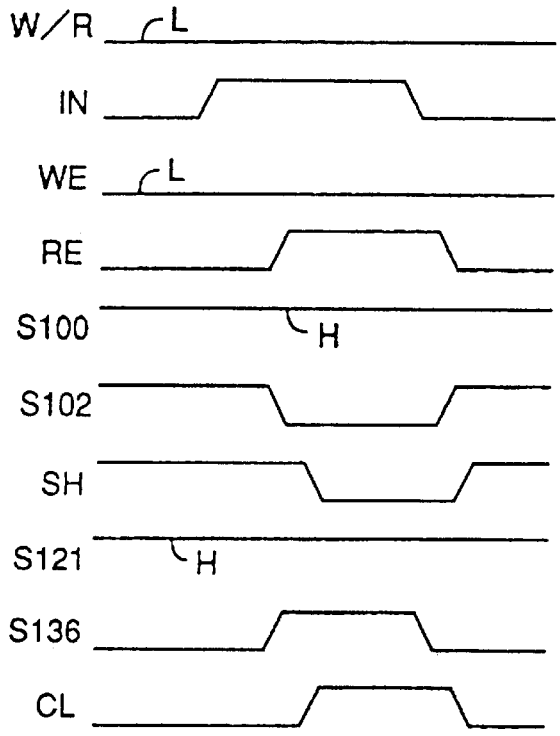
FIGS. 16A and 16B are waveform diagrams of an operation of the third embodiment of the present invention.
Figure 16B:
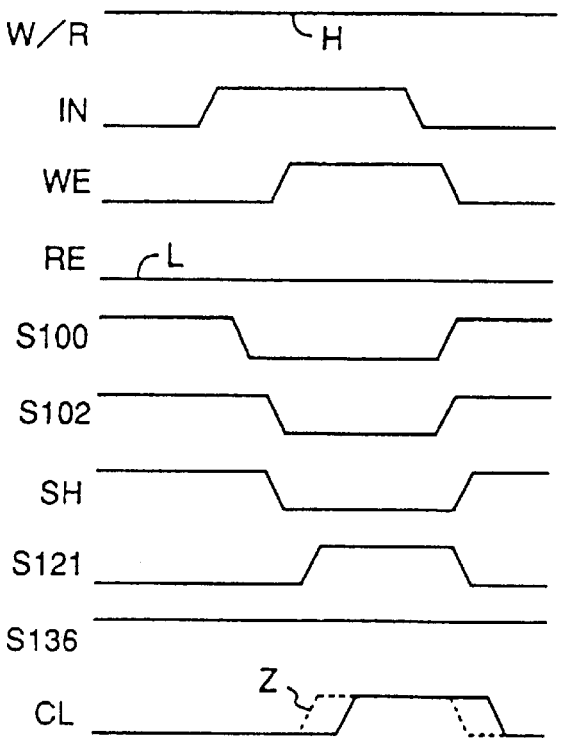

FIGS. 16A and 16B are waveform diagrams of an operation of the third embodiment of the present invention. More particularly, FIG. 16A shows a read operation, and FIG. 16B shows a write operation. The write enabling controller 89, the read enabling controller 95, the write-time shortcircuiting controller 100, the read-time shortcircuiting controller 106 of the third embodiment of the present invention operate in the same manner as those of the first embodiment of the present invention.

In the read operation, the write/read indication signal W/R is set to the low level. In this case, the write controller 135 operates so that the output signals of the inverters 137 and 138 are high and low, respectively, and the output signal of the NAND circuit 139 is high. In this case, when the timing signal IN is low, the read-time column controller 136 operates as follows. The output signal of the inverter 123 is high, and the output signal of the NAND circuit 140 is low. The output signal of the NAND circuit 125 is high, and the output signal S136 of the read-time column controller 136 is low.

The write-time column controller 121 operates as follows. The output signal of the NAND circuit 127 is high, and the output signal of the NAND circuit 128 is low. The output signal of the NAND circuit 129 is high, and the output signal of the inverter 130 is low. Thus, the output signal S121 of the write-time column controller 121 is high. Hence, in the column controller 122, the output signal of the NAND circuit 132 is high, and the column control signal CL is low.

When the timing signal IN switches to the high level from the above state, the read-time column controller 136 operates as follows. The output signal of the inverter 123 is low, and the output signal of the NAND circuit 140 is high. The output signal of the NAND circuit 125 is low, and the output signal S136 of the read-time column controller 136 is high. Hence, in the column controller 122, the output signal of the NAND circuit 132 is low, and the column control signal CL is high.

In the write-time column controller 121, the output signal of the NAND circuit 127 is high, and the output signal of the NAND circuit 128 is low. The output signal of the NAND circuit 129 is high, and the output signal of the inverter 130 is low. Hence, the output signal S121 of the write-time column controller 121 is maintained at the high level.

The timing at which the column control signal CL is switched to the high level, is determined by the total of the delay times of the read-time column controller 136 and the column controller 122. The total of the delay times of the read-time column controller 136 and the column controller 122 is approximately equal to the total of the delay times of the read-time shortcircuiting controller 102 and the shortcircuiting controller 106. Hence, the timing at which the column control signal CL is switched to the high level substantially coincides with that of the first embodiment of the present invention.

Thereafter, if the timing signal IN becomes low, the read-time column controller 136 operates as follows. The output signal of the inverter 123 is high, and the output signal of the NAND circuit 140 is low. The output signal of the NAND circuit 125 is high, and the output signal S136 of the read-time column controller 136 is low.

Hence, in the column controller 122, the output signal of the NAND circuit 132 is high, and the column control signal CL is low. The timing at which the column control signal CL is low substantially coincides with that of the first embodiment of the present invention.

In the write operation, the write/read indication signal W/R is switched to the high level. In this case, the write controller 135 operates so that the output signal of the inverters 137 and 138 are low and high, respectively, and the output signal of the NAND circuit 139 is low.

When the timing signal IN is low, the read-time column controller 136 operates as follows. The output signal of the inverter 123 is high and the output signal of the NAND circuit 140 is high. The output signal of the NAND circuit 125 is low, and the output signal S136 of the read-time column controller 136 is high. In the write-time column controller 121, the output signal of the NAND circuit 127 is low, and the output signal of the NAND circuit 128 is high. The output signal of the NAND circuit 129 is low, and the output signal of the inverter 130 is high. Hence, the output signal S121 of the write-time column controller 121 is low. Hence, in the column controller 122, the output signal of the NAND circuit 132 is high, and the column control signal CL is low.

When the timing signal IN switches to the high level from the above state, the read-time column controller 136 operates as follows. Although the output signal of the inverter 123 is low, the output signal of the NAND circuit 140 is high, and the output signal of the NAND circuit 125 is low. Hence, the output signal S136 of the read-time column controller 136 is maintained at the high level. In the write-time column controller 121, the output signal of the NAND circuit 127 is high, and the output signal of the NAND circuit 128 is low. The output signal of the NAND circuit 129 is high, and the output signal of the inverter 130 is low. Hence, the output signal S121 of the write-time column controller 121 is high. Hence, in the column controller 122, the output signal of the NAND circuit 132 is low, and the column control signal CL is high.

The timing at which the column control signal CL rises is determined by the total of the delay times of the write-time column controller 121 and the column controller 122. The total of the delay times of the write-time column controller 121 and the column controller 122 is longer than the total of the delay times of the read-time column controller 136 and the column controller 122, and is therefore much more delayed than that of the first embodiment of the present invention (but is equal to the total delay time of the second embodiment of the present invention). A broken line Z shown in FIG. 16B indicates the column control signal CL used in the first embodiment of the present invention.

Thereafter, when the timing signal IN becomes low, the read-time column controller 136 operates as follows.

Although the output signal of the inverter 123 is high, the output signals of the NAND circuits 140 and 125 are respectively high and low. Hence, the output signal S136 of the read-time column controller 136 is maintained at the high level. In the write-time column controller 121, the output signal of the NAND circuit 127 is low, and the output signal of the NAND circuit 128 is high. The output signal of the NAND circuit 129 is low, and the output signal of the inverter 130 is high. Hence, the output signal S121 of the write-time column controller 121 is low. Hence, in the column controller 122, the output signal of the NAND circuit 132 is high, and the column control signal CL is low.

The timing at which the column control signal CL falls is determined by the total of the write-time column controller 121 and the column controller 122 as in the case of the rising of the column control signal CL. Hence, the above falling timing is much more delayed than the timings in the first and second embodiments of the present invention. Hence, the column control signal CL used in the write operation has a waveform which is just like a delayed version of the column control signal CL used in the read operation. Hence, it is possible to ensure a sufficient write time.

In this case, there is no problem in which the column control signal CL rises and the corresponding column is selected when the operation mode is switched from the read mode to the write mode or vice versa. That is, in the case where the write/read indication signal W/R is switched to the low level to enable the read mode, the write-time column controller 121 operates as follows. The output signal of the NAND circuit 127 is high, and the output signal of the NAND circuit 128 is low. The output signal of the NAND circuit 129 is high, and the output signal of the inverter 130 is low. Further, the output signal of the inverter 131 is high.

In the write controller 135, the output signal of the inverters 137 and 138 are respectively high and low, and the output signal of the NAND circuit 139 is high. In the read-time column controller 136, the output signal of the inverter 123 is high, and the output signal of the NAND circuit 140 is low. The output signal of the NAND circuit 125 is high, and the output signal of the NAND circuit 126 is low. In the column controller 122, the output signal o the NAND circuit 132 is high, and the column control signal CL is low.

When the write/read indication signal W/R is switched to the high level to enable the write mode, the write controller 135 operates as follows. The output signal of the inverter 137 is low, and the output signal of the inverter 138 is high. The output signal of the NAND circuit 139 is low. Hence, in the read-time column controller 136, the output signal of the NAND circuit 140 is high, and the output signal of the NAND circuit 125 is low. The output signal of the NAND circuit 126 is high.

In the write-time column controller 121, the output signal of the NAND circuit 127 is low, and the output signal of the NAND circuit 128 is high. The output signal of the NAND circuit 128 is low, and the output signal of the inverter 130 is high. The output signal of the inverter 131 is low.

The timing at which the output signal S136 of the read-time column controller 136 is inverted to the high level is determined by the total of the delay times of the inverters 137 and 138 and the NAND circuits 139, 140, 125 and 126. The timing at which the output signal S121 of the write-time column controller 121 is inverted to the low level is determined by the total of the delay times of the NAND circuits 127–129 and the inverters 130 and 131.

Hence, in this case, the timing at which the output signal S136 of the read-time column controller 136 is inverted to the high level leads to the timing at which the output signal S121 of the write-time column controller 121 is inverted to the low level. In the column controller 122, the output signal of the NAND circuit 132 is high, and the column control signal CL is maintained at the low level.

When the timing signal IN becomes low in the case where the write/read indication signal W/R is set to the high level to enable the write operation, the write controller 135 operates as follows. The output signals of the inverters 137 and 138 are respectively low and high, and the output signal of the NAND circuit 139 is low. In the read-time column controller 136, the output signal of the inverter 123 is high, and the output signal of the NAND circuit 140 is high. The output signal of the NAND circuit 125 is low, and the output signal of the NAND circuit 126 is high.

In the write-time column controller 121, the output signal of the NAND circuit 127 is low, and the output signal of the NAND circuit 128 is high. The output signal of the NAND circuit 129 is low, and the output signals of the inverters 130 and 131 are high and low, respectively. In the column controller 122, the output signal of the NAND circuit 132 is high, and the column control signal CL is low.

When the write/read indication signal W/R is switched to the low level to thereby enable the read mode, the write-time column controller 121 operates as follows. The output signal of the NAND circuit 127 is high, and the output signal of the NAND circuit 128 is low. The output signal of the NAND circuit 129 is high, and the output signals of the inverters 130 and 131 are low and high, respectively.

In the write controller 135, the output signal of the NAND circuit 139 is high. Hence, in the read-time column controller 136, the output signal of the NAND circuit 140 is low, and the output signal of the NAND circuit 125 is high. Further, the output signal of the NAND circuit 126 is low.

The timing at which the output signal S121 of the write-time column controller 121 is inverted to the high level is determined by the total of the delay times of the NAND circuits 127–129 and the inverters 130 and 131. The timing at which the output signal S136 of the read-time column controller 136 is switched to the low level is determined by the total of the delay times of the NAND circuits 139, 140, 125 and 126.

In the above case, the timing at which the output signal S121 of the write-time column controller 121 is inverted to the high level leads to the timing at which the output signal S136 of the read-time column controller 136 is inverted to the low level. Thus, in the column controller 122, the output signal of the NAND circuit 132 is high and the column control signal CL is maintained at the low level.

According to the third embodiment of the present invention, it is possible to avoid the following problems and to reduce the operation cycle and speed up the read and write operations. That is, even in the case where in the read operation, the selected local data bus lines LDB and /LDB and the global data bus lines GDB and /GDB are completely precharged to the precharge voltage VP and thereafter data captured by the sense amplifier is transferred to the local data bus lines, it is possible to avoid a situation in which the global data bus lines GDB and /GDB are shortcircuited in the write operation before the complementary signals output to the global data bus lines GDB and /GDB from the write amplifier 41 have a sufficient potential difference. Further, it is possible to avoid a delay in data transfer due to a collision of the complementary data signals output to the global data bus lines GDB and /GDB from the write amplifier 41 and the complementary data signals output from the sense amplifier and to thereby speed up the read and write operations. Furthermore, it is possible to lengthen the high-level period of the column control signal CL to speed up the read and write operations.

In the above-mentioned first through third embodiments of the present invention, the shortcircuiting transistor 39 and the precharging circuit 43, which operates when the column-system circuits operate, are provided as means for precharging the global data bus lines GDB and /GDB and the selected local data bus lines LDB and /LDB. However, it is possible to omit the precharging circuit 43.

It is possible to replace the precharging circuit 43 by another precharging circuit which performs the precharging operation in response to a signal synchronized with the shortcircuiting signal SH. More particularly, the substitute precharging circuit operates during the period when the column-system circuits operate. That is, the substitute precharging circuit supplies the precharge voltage VP to the global data bus lines GDB and /GDB during the period when these bus lines are being shortcircuited. The substitute precharging circuit do not supply the precharge voltage VP to the global data bus lines GDB and /GDB during the period when these bus lines are not in the precharged state.

In the above-mentioned first through third embodiments of the present invention, a plurality of pairs of local data bus lines and a pair of global data bus lines are used. However, the present invention includes a semiconductor memory device in which data buses are not divided into local and global data buses, but the shortcircuiting transistor 39, the sense buffer 40 and the write amplifier 41 are connected to the data bus to which the sense amplifier is connected.

The present invention is not limited to the SDRAM devices but include another memory device such as an asynchronous-type DRAM device in which the read and write operations can continuously be carried out.

The present invention is not limited to the specifically disclosed embodiments and variations and modifications may be made without departing from the scope of the present invention.

What is claimed is:

1. A method of controlling data transmission lines of a semiconductor memory [device] which has a first pair of data transmission lines to which a sense amplifier and memory cells are connected, and a second pair of data transmission lines to which a read circuit and a write circuit are connected [at an end of the second pair of the data transmission lines], *and* which is connected to the first pair of data transmission lines via a [column gate] *switch*, said method comprising:

a) shortcircuiting the second pair of data transmission lines for a first period [when a read operation is carried out] *in a read mode*; and b) shortcircuiting the second pair of data transmission lines for a second period [when a write operation is carried out] *in a write mode*, and second period being shorter than the first period.

2. A semiconductor [device] *memory* comprising:

memory cells;

a sense amplifier;

a first pair of data transmission lines to which the sense amplifier and *the* memory cells are connected;

a second pair of data transmission lines to which a read circuit and a write circuit are connected [at an end of the second pair of the data transmission lines], *and* which is connected to the first pair of data transmission lines via a [column gate] *switch*;

a shortcircuiting element which can shortcircuit the second pair of transmission a first control circuit which controls the shortcircuiting element so that the second pair of data transmission lines is shortcircuited for a first period [when a read operation is carried out] *in a read mode*, and the second pair of data transmission lines is shortcircuited for a second period [when a write operation is carried out] *in the write mode*, said second period being shorter than the first period.

[3. The semiconductor memory device as claimed in claim 2, wherein the second pair of data transmission lines comprises:

a third pair of data transmission lines to which the first pair of data transmission lines is connected; and a fourth pair of data transmission lines to which the read circuit and the write circuit are connected, the fourth pair of data transmission lines being coupled to the third pair of data transmission lines via a switch circuit.]

4. The semiconductor memory [device] as claimed in claim 2, further comprising a precharging circuit which supplies a precharge voltage to the second pair of data transmission lines.

5. The semiconductor memory [device] as claimed in claim 4, wherein said precharging circuit supplies the precharge voltage to the second pair of data transmission lines while the second pair of data transmission lines is being shortcircuited, and does not supply the precharge voltage thereto when the second pair of data transmission lines is not shortcircuited.

6. The semiconductor memory [device] as claimed in claim 2, *further comprising:*

*a column gate controlled by a first signal, and disposed between the first pair of data transmission lines and the sense amplifier, and* wherein the first control circuit controls the shortcircuiting element so that a timing at which the second pair of data transmission lines [is] *initiates to be* shortcircuited substantially coincides with [a] *an inactivation timing of the* first signal [defining an operation timing] in the read and write [operations] *modes*, and a timing at which the second pair of data transmission lines is released from a shortcircuited state in the write [operation] *mode* is earlier[, with respect to] *than an activation timing of* the first signal, *and* than a timing at which the second pair of data transmission lines is released from the shortcircuited state in the read [operation] *mode.*

7. The semiconductor memory [device] as claimed in claim 4, wherein the first control circuit controls the shortcircuiting element so that the second pair of data transmission lines is released from a shortcircuited state in the read [operation] *mode* after the second pair of data transmission lines [is] *completes to be* precharged to the precharge voltage.

8. The semiconductor memory [device] as claimed in claim 4, wherein the first control circuit controls the shortcircuiting element so that the second pair of data transmission lines is released from a shortcircuited state in the write [operation] *mode* before the second pair of data transmission lines [is] *completes to be* precharged to the precharge voltage.

9. The semiconductor memory [device] as claimed in claim 8, wherein said write circuit has a driving capability of setting the second pair of data transmission lines to the precharge voltage [faster], *when the write circuit inverts complementary signals on the second pair of data transmis-*

*sion lines larger* than *driving capability of* the precharging circuit [precharges] *precharging* the second pair of data transmission lines to the precharge voltage [when the write circuit inverts complementary signal on the second pair of data transmission lines].

10. The semiconductor memory [device] as claimed in claim 2, wherein said first control circuit comprises:

a second control circuit which controls timings at which the second pair of data transmission lines is [shortcircuited and] released from a shortcircuited state in the write [operation] *mode*;

a third control circuit which controls timings at which the second pair of data transmission lines is shortcircuited and released from the shortcircuited state in the read [operation] *mode*; and a fourth control circuit which controls a timing at which the shortcircuiting element shortcircuits *and releases from the shortcircuited state of* the second pair of data transmission lines [on the basis of] *in response to* output signals of the second and third control circuits.

11. The semiconductor memory [device] as claimed in claim 10, wherein:

the second control circuit comprises a first NAND circuit which [performs a NAND operation on] *receives* a [first] *second* signal defining an operation timing and a [second] *third* signal indicating [whether an operation mode of the semiconductor memory device is] the write [operation] *mode* or the read [operation] *mode*;

the third control circuit comprises a first delay circuit delaying the [first] *second* signal, and a second NAND circuit [performing a NAND operation] *receiving* an output signal of the first delay circuit and the [first] *second* signal; and the fourth control circuit comprises a third NAND circuit [performing a NAND operation on] *receiving* an output signal of the second control circuit and an output signal of the third control circuit, and a first inverting delay circuit which inverts and delays an output signal of the third NAND circuit.

12. The semiconductor memory [device] as claimed in claim 11, wherein the [first] *second* signal is a signal synchronized with an external clock applied to the semiconductor memory [device].

13. The semiconductor memory [device] as claimed in claim 2, further comprising a [second] *fifth* control circuit which [controls enabling of] *activates* the write circuit which outputs data to the second pair of data transmission lines at almost the same time as the second pair of data transmission lines is released from a shortcircuited state.

14. The semiconductor memory [device] as claimed in claim 13, wherein said [second] *fifth* control circuit controls the write circuit [on the basis of] *in response to* a [first] *second* signal defining an operation timing and a [second] *third* signal indicating [whether an operation mode of the semiconductor memory device is] the write [operation] *mode* or the read [operation] *mode*.

15. The semiconductor memory [device] as claimed in claim 14, wherein said [second] *fifth* control circuit comprises:

a first inverting circuit which inverts the [first] *second* signal;

a second inverting circuit which inverts the [second] *third* signal;

a first NOR circuit which [performs a NOR operation on] *receives* output signals of the first and second inverting circuits; and a [first] *second* delay circuit which delays an output signal of the first NOR circuit.

16. The semiconductor memory [device] as claimed in claim 2, further comprising a [second] *sixth* control circuit which [controls enabling of] *activates* the [write] *read* circuit [on the basis of] *in response to* a [first] *second* signal defining an operation timing and a [second] *third* signal indicating [whether an operation mode of the semiconductor memory device is] the write [operation] *mode* or the read [operation] *mode*.

17. The semiconductor memory [device] as claimed in claim 16, wherein said [second] *sixth* control circuit comprises:

a [first] *third* inverting circuit which inverts the [first] *second* signal;

a [first] *second* NOR circuit which [performs a NOR operation on] *receives* an output signal of the [first] *third* inverting circuit and the [second] *third* signal; and a [first] *third* delay circuit which delays an output signal of the [first] *second* NOR circuit.

18. The semiconductor memory [device] as claimed in claim 6, further comprising a [second] *seventh* control circuit which delays the [first] *second* signal to generate [a third] *the first* signal used to control [timings at which the column gate is selected and released from a selected state at respective timings] *the column gate*, which are [common to] *commonly used in* the read [operation] *mode* and the write [operation] *mode*.

19. The semiconductor memory [device] as claimed in claim 2, further comprising:

*a column gate controlled by a first signal, and disposed between the first pair of data transmission lines and the sense amplifier;*

[a second] *an eighth* control circuit which controls timings at which [a column] *the first signal* is [selected and released from a selected state] *outputted to the column gate* in the read and write [operations] *modes*; and a [third] *ninth* control circuit which [controls timings at which the column gate is selected and released from the selected state,] *is coupled to the eighth control circuit, for outputting the first signal*;

wherein [the] *an activation* timing [at which the column gate is selected] *of the first signal* in the write [operation] *mode* lags behind [the] *an activation* timing [at which] of the [column gate is selected] *first signal* in the read [operation] *mode* and [the] *an inactivation* timing [at which the column gate is released from the selected state] *of the first signal* in the read [operation] *mode* substantially coincides with [the] *an inactivation* timing [at which the column gate is released from the selected state] *of the first signal* in the write [operation] *mode*.

20. The semiconductor memory [device] as claimed in claim 19, wherein the [second] *eighth* control circuit comprises:

a [first] *fourth* inverting circuit which inverts a [first] *second* signal defining an operation timing:

a [first] *second* inverting delay circuit which inverts and delays an output signal of the [first] *fourth* inverting circuit;

a [first] *fourth* NAND circuit which [performs a NAND operation on] *receives* a [second] *third* signal indicating [whether an operation mode of the semiconductor memory device is] the write [operation] *mode* or the read [operation] *mode* and [an] *the* output signal of the [first] *fourth* inverting circuit; and a [first] *fourth* delay circuit which delays an output signal of the [first] *fourth* NAND circuit; and wherein the [third] *ninth* control circuit comprises:

a [second] *fifth* NAND circuit which [performs a NAND operation on] *receives* an output signal of the [first] *second* inverting delay circuit and an output signal of the [first] *fourth* delay circuit; and a [second] *fifth* inverting circuit which inverts an output signal of the [second] *fifth* NAND circuit.

21. The semiconductor memory [device] as claimed in claim 2, further comprising:

*a column gate controlled by a first signal, and disposed between the first pair of data transmission lines and the sense amplifier;* a [second] *tenth* control circuit which controls timings at which [a column] *the first signal* is [selected and released from a selected state] *outputting to the column gate* in the read [operation] *mode*;

[a third] *an eleventh* control circuit which controls timing at which [a column is selected and released from the selected state] *the first signal is outputted to the column gate* in the write [operation] *mode*;

a [fourth] *twelfth* control circuit which generates [, from] *the first signal in response to* output signals of the [second] *tenth* and [third] *eleventh* control circuits [, a third signal which controls timings at which the column gate is selected and released from the selected state]; and a [fifth] *thirteenth* control circuit which controls the [second] *tenth* control circuit, wherein [the] *an activation and an inactivation* timings [at which the column gate is selected and released from the selected state] *of the first signal* in the write [operation] *mode* lag behind the [timings at which the column gate is selected and released from the selected state] *activation and the inactivation of the first signal* in the read [operation] *mode, respectively.*

22. The semiconductor memory [device] as claimed in claim 21 wherein said [second] *tenth* control circuit comprises:

a [first] *sixth* inverting circuit which inverts a [first] *second* signal defining an operation timing;

a [first] *sixth* NAND circuit which [performs a NAND operation on] *receives* an output signal of the [first] *sixth* inverting circuit and an output signal of the [fifth] *thirteenth* control circuit; and a [first] *fifth* delay which delays an output signal of the [first] *sixth* NAND circuit, wherein said [third] *eleventh* control circuit comprises:

a [second] *seventh* NAND circuit which [performs a NAND operation on] *receives* a [second] *third* signal indicating [whether an operation mode of the semiconductor memory device is] the write [operation] *mode* or the read [operation] *mode* and an output signal of the [first] *sixth* inverting circuit; and a [second] *sixth* delay circuit which delays an output signal of the [second] *seventh* NAND circuit, wherein said [fourth] *twelfth* control circuit comprises:

[a third] *an eighth* NAND circuit which [performs a NAND operation on] *receives* output signals of the [second] *tenth* and [third] *eleventh* control circuits; and a [second] *seventh* inverting circuit which inverts an output signal of the [third] *eighth* NAND circuit, and wherein said [fifth] *thirteenth* control circuit comprises:

a [third] *seventh* delay circuit which delays the [second] *third* signal; and a [fourth] *ninth* NAND circuit which [performs a NAND operation on] *receives* an output signal of the [third] *seventh* delay circuit and the [second] *third* signal.

*23. A semiconductor memory having a read mode and a write mode, comprising:*

*a sense amplifier;*

*a pair of data transmission lines for coupling the sense amplifier and a read circuit or a write circuit;*

*a shortcircuit switch for shortcircuiting the pair of data transmission lines;*

*a control circuit receiving a control signal which indicates the read mode or the write mode, for controlling an operation of the shortcircuit switch in response to the control signal;*

*wherein an OFF timing of the shortcircuit switch in the write mode is different from that in the read mode.*

*24. The semiconductor memory as claimed in claim 23, wherein*

*the OFF timing of the shortcircuit switch in the write mode is earlier than that in the read mode.*

*25. The semiconductor memory as claimed in claim 24, the pair of data transmission lines including:*

*a first pair of data transmission lines coupled to the sense amplifier; and*

*a second pair of data transmission lines coupled between the first pair of data transmission lines and the write circuit;*

*wherein the shortcircuit switch is disposed between the second pair of data transmission lines.*

*26. The semiconductor memory as claimed in claim 25, wherein the shortcircuit switch is disposed in vicinity of the write circuit.*

*27. The semiconductor memory as claimed in claim 25, further comprising:*

*a precharge circuit for supplying a precharge voltage to the second pair of data transmission lines.*

*28. The semiconductor memory as claimed in claim 27, wherein*

*the precharge circuit supplies the precharge voltage to the second pair of data transmission lines while the second pair of data transmission lines is being shortcircuited, and does not supply the precharge voltage thereto when the second pair of data transmission lines is not shortcircuited.*

*29. The semiconductor memory as claimed in claim 27, wherein*

*the control circuit turns the shortcircuit switch OFF before both of the second pair of data transmission lines complete to be precharged to the precharge voltage, in the write mode.*

*30. The semiconductor memory as claimed in claim 27, wherein*

*the control circuit turns the shortcircuit switch OFF after both of the second pair of data transmission lines completes to be precharged to the precharge voltage, in the read mode.*

*31. The semiconductor memory as claimed in claim 23, further comprising:*

*a column gate controlled by a column selection signal, for coupling the sense amplifier and the pair of data transmission lines; wherein*

*the OFF timing of the shortcircuit switch in the read mode is substantially same as an activation timing of the column selection signal, and*

*an ON timing of the shortcircuit switch in the read mode is substantially same as an inactivation timing of the column selection signal.*

*32. The semiconductor memory as claimed in claim 23, further comprising:*

*a column gate controlled by a column selection signal, for coupling the sense amplifier and the pair of data transmission lines; wherein*

*the OFF timing of the shortcircuit switch in the write mode is earlier than an activation timing of the column selection signal.*

*33. The semiconductor memory as claimed in claim 32, wherein*

*the OFF timing of the shortcircuit switch in the write mode is substantially same as an activation timing of the write circuit.*

*34. The semiconductor memory as claimed in claim 23, further comprising:*

*a column gate controlled by a column selection signal, for coupling the sense amplifier and the pair of data transmission lines; wherein*

*an activation timing of the column selection signal in the read mode is earlier than that in the write mode.*

*35. The semiconductor memory as claimed in claim 34, wherein*

*an inactivation timing of the column selection signal in the read mode is earlier than that in the write mode.*

*36. A method of controlling data transmission lines of a semiconductor memory having a read mode and a write mode, including a pair of data transmission for coupling a sense amplifier and a read circuit or a write circuit and a shortcircuit switch for shortcircuiting the pair of data transmission lines; said method comprising:*

*a) turning the shortcircuit switch OFF at a first timing in the read mode;*

*b) turning the shortcircuit switch OFF at a second timing in the write mode, the second timing being earlier than the first timing.*

*37. A semiconductor memory having a read mode and a write mode, comprising:*

*a sense amplifier;*

*a pair of data transmission lines for coupling the sense amplifier and a read circuit or a write circuit;*

*a shortcircuit switch for shortcircuiting the pair of data transmission lines;*

*a control circuit receiving a control signal which indicates the read mode or the write mode, for controlling an operation of the shortcircuit switch in response to the control signal;*

*a precharge circuit for supplying a precharge voltage to the pair of data transmission lines;*

*wherein an OFF timing of the shortcircuit switch in the write mode is earlier than a precharge completion timing of the pair of data transmission lines.*

*38. The semiconductor memory as claimed in claim 37, wherein*

*the OFF timing of the shortcircuit switch is substantially same timing as an activation timing of the write circuit.*

*39. A semiconductor memory having a read mode and a write mode, comprising:*

*a sense amplifier;*

*a pair of data transmission lines for coupling the sense amplifier and a read circuit or a write circuit;*

*a shortcircuit switch receiving a shortcircuit signal for shortcircuiting the pair of data transmission lines; and*

*a control circuit receiving a timing signal and a control signal which indicates the read mode or the write mode, for outputting the shortcircuit signal in response to the timing signal and the control signal,*

*wherein the control circuit includes:*

*a first part receiving the timing signal and the control signal for outputting a second timing signal to control an output timing of the shortcircuit signal in the write mode; and*

*a second part receiving the timing signal for outputting a third timing signal to control the output timing of the shortcircuit in the read mode.*

*40. The semiconductor memory as claimed in claim 39, wherein an OFF timing of the shortcircuit switch in the write mode is earlier than that in the read mode.*

*41. The semiconductor memory as claimed in claim 39, wherein a first delay time in the write mode produced by the first part is shorter than a second delay time in the read mode produced by the second part.*

*42. The semiconductor memory as claimed in claim 39, the pair of data transmission lines including:*

*a first pair of data transmission lines coupled to the sense amplifier; and*

*a second pair of data transmission lines coupled between the first pair of data transmission lines and the write circuit;*

*wherein the shortcircuit switch is disposed between the second pair of data transmission lines.*

*43. The semiconductor memory as claimed in claim 42, further comprising:*

*a precharge circuit for supplying a precharge voltage to the second pair of data transmission lines.*

*44. The semiconductor memory as claimed in claim 43, wherein*

*the precharge circuit supplies the precharge voltage to the second pair of data transmission lines while the second pair of data transmission lines is being shortcircuited, and does not supply the precharge voltage thereto when the second pair of data transmission lines is not shortcircuited.*

*45. The semiconductor memory as claimed in claim 44, wherein*

*the control circuit turns the shortcircuit switch OFF before each lines of the second pair of data transmission lines completes to be precharged to the precharge voltage, in the write mode.*

*46. The semiconductor memory as claimed in claim 44, wherein*

*the control circuit turns the shortcircuit switch OFF after each line of the second pair of data transmission lines completes to be precharged to the precharge voltage, in the read mode.*

*47. The semiconductor memory as claimed in claim 40, wherein*

*the OFF timing of the shortcircuit switch in the write mode is substantially same as an activation timing of the write circuit.*

* * * * *